(12) United States Patent
Murooka

(10) Patent No.: US 9,324,425 B2
(45) Date of Patent: *Apr. 26, 2016

(54) MEMORY DEVICE, METHOD OF CONTROLLING MEMORY DEVICE, AND MEMORY SYSTEM

(71) Applicant: Kabushiki Kaisha Toshiba, Minato-ku (JP)

(72) Inventor: Kenichi Murooka, San Jose, CA (US)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/809,703

(22) Filed: Jul. 27, 2015

(65) Prior Publication Data
US 2015/0332765 A1    Nov. 19, 2015

Related U.S. Application Data

(63) Continuation of application No. 14/156,595, filed on Jan. 16, 2014, now Pat. No. 9,123,411.

(60) Provisional application No. 61/889,581, filed on Oct. 11, 2013.

(51) Int. Cl.
*G11C 11/34* (2006.01)
*G11C 16/04* (2006.01)
*G11C 13/00* (2006.01)
*G11C 7/10* (2006.01)
(Continued)

(52) U.S. Cl.
CPC .......... *G11C 13/0033* (2013.01); *G11C 7/1006* (2013.01); *G11C 13/0002* (2013.01); *G11C 13/004* (2013.01); *G11C 13/0023* (2013.01); *G11C 13/0026* (2013.01); *G11C 13/0028* (2013.01); *G11C 13/0069* (2013.01); *H01L 27/249* (2013.01); *H01L 27/2454* (2013.01); *H01L 45/16* (2013.01); *G11C 2213/71* (2013.01)

(58) Field of Classification Search
CPC .......... G11C 13/0002; G11C 2213/71; G11C 13/0097; G11C 13/0007; G11C 13/0023; G11C 7/1006; G11C 5/025; G11C 13/0026; G11C 13/0028; G11C 16/10; G11C 7/18; H01L 27/2436; H01L 27/2481; H01L 27/249; H01L 45/145
See application file for complete search history.

(56) References Cited

U.S. PATENT DOCUMENTS 7,480,184 B2  1/2009 Lam
7,920,408 B2  4/2011 Azuma et al.
8,255,770 B2  8/2012 Park et al.
(Continued)

*Primary Examiner* — Hien Nguyen
(74) *Attorney, Agent, or Firm* — Oblon, McClelland, Maier & Neustadt, L.L.P.

(57) ABSTRACT

A memory device according to an embodiment comprises a data processing circuit that includes: a data write pre-processing circuit that processes input data to generate first intermediate data; a data write processing circuit that sequentially sets a voltage difference between a selected row line and a selected global bit line based on the first intermediate data; a data read processing circuit that detects a current flowing in the selected global bit line or a voltage of the selected global bit line and sequentially generates second intermediate data from a result of that detection; and a data read post-processing circuit that processes the second intermediate data to generate output data, the data write pre-processing circuit and the data read post-processing circuit having a correcting function that corrects a difference that may occur between the input data and the output data.

20 Claims, 32 Drawing Sheets

(51) Int. Cl.
*H01L 45/00* (2006.01)
*H01L 27/24* (2006.01)

(56) References Cited

U.S. PATENT DOCUMENTS

| | | |
|---|---|---|
| 2008/0055990 A1 | 3/2008 | Ishikawa et al. |
| 2008/0239818 A1 | 10/2008 | Mokhlesi et al. |
| 2011/0231735 A1 | 9/2011 | Park et al. |
| 2012/0020142 A1 | 1/2012 | Yu et al. |
| 2012/0069626 A1 | 3/2012 | Nakano et al. |
| 2012/0147644 A1 | 6/2012 | Scheuerlein |
| 2012/0147645 A1 | 6/2012 | Scheuerlein |
| 2012/0147646 A1 | 6/2012 | Scheuerlein |
| 2012/0147647 A1 | 6/2012 | Scheuerlein |
| 2012/0147648 A1 | 6/2012 | Scheuerlein |
| 2012/0147649 A1 | 6/2012 | Samachisa et al. |
| 2012/0147650 A1 | 6/2012 | Samachisa et al. |
| 2012/0147651 A1 | 6/2012 | Scheuerlein et al. |
| 2012/0147652 A1 | 6/2012 | Scheuerlein |
| 2012/0147689 A1 | 6/2012 | Scheuerlein et al. |
| 2012/0314480 A1 | 12/2012 | Onishi et al. |
| 2013/0148400 A1 | 6/2013 | Murooka |
| 2013/0187118 A1 | 7/2013 | Murooka |
| 2015/0103581 A1* | 4/2015 | Murooka ........... G11C 13/0033 365/148 |

\* cited by examiner

GWL

Power Supply Line

→ X

|  | Write (Reset) | Write (Set) | Read |
|---|---|---|---|
| SSG_s | Vg_w | Vg_e | Vg_r,0 |
| SSG_n | Vg_w | Vg_e | Vg_r,0 |
| SSG_u | 0 | 0 | 0 |
| GBL_s | Vw | Vof | Vr+Vo |
| GBL_u | Vwf | Vef+Vof | Vr+Vo |
| WL_s | 0 | Ves+Vof | Vo |
| WL_u | Vwf | Vef+Vof | Vr+Vo |

MEMORY DEVICE, METHOD OF CONTROLLING MEMORY DEVICE, AND MEMORY SYSTEM

CROSS-REFERENCE TO RELATED APPLICATIONS

This application is a continuation of and claims the benefit of priority under 35 U.S.C. §120 from U.S. Ser. No. 14/156,595 filed Jan. 16, 2014, and claims the benefit of priority from U.S. Provisional Application 61/889,581 filed Oct. 11, 2013, the entire contents of each of which are incorporated herein by reference.

BACKGROUND

1. Field

Embodiments of the present invention relate to a memory device, a method of controlling the memory device, and a memory system.

2. Description of the Related Art

In recent years, a memory called ReRAM that has a resistance varying material as a memory cell has been proposed. Because it is easy for ReRAM to form three-dimensional stacking structure, a degree of integration of ReRAM can be improved compared to memory cells disposed in a two-dimensional planar manner.

However, as three-dimensional stacking, it is important to suppress influencing between memory cells, to improve access speed of the memory, and so on.

DETAILED DESCRIPTION

A memory device according to an embodiment comprises: in the case that three directions intersecting each other are assumed to be an X direction, a Y direction, and a Z direction, a memory cell array including: row lines that are aligned in a two-dimensional array shape in the Y direction and the Z direction and extend in the X direction; column lines that are aligned in a two-dimensional array shape in the X direction and the Y direction and extend in the Z direction; global bit lines that are aligned in the X direction and extend in the Y direction; selection elements that are provided at ends of the column lines; and cells that are provided between the row lines and the column lines; a selection circuit including: a row line selection circuit being configured to select at least one selected row lines from the row lines; a global bit line selection circuit being configured to select at least one selected global bit lines from the global bit lines; and a selection element control circuit being configured to control the selection elements to connect/disconnect between the global bit line and one of the column lines; and a data processing circuit including: a data write pre-processing circuit being configured to process input data to generate first intermediate data; a data write processing circuit being configured to sequentially set a voltage difference between the selected row line and the selected global bit line based on the first intermediate data; a data read processing circuit being configured to detect a current flowing in the selected global bit line or a voltage of the selected global bit line and sequentially generate second intermediate data from a result of that detection; and a data read post-processing circuit being configured to process the second intermediate data to generate output data, and the data write pre-processing circuit and the data read post-processing circuit being configured to correct a difference that may occur between the input data and the output data.

A memory device, a method of controlling a memory device, and a memory system according to embodiments will be described below with reference to the drawings.

First Embodiment

First, a structure of a memory cell array 100 of a memory device according to a first embodiment will be described.

Figure 1:
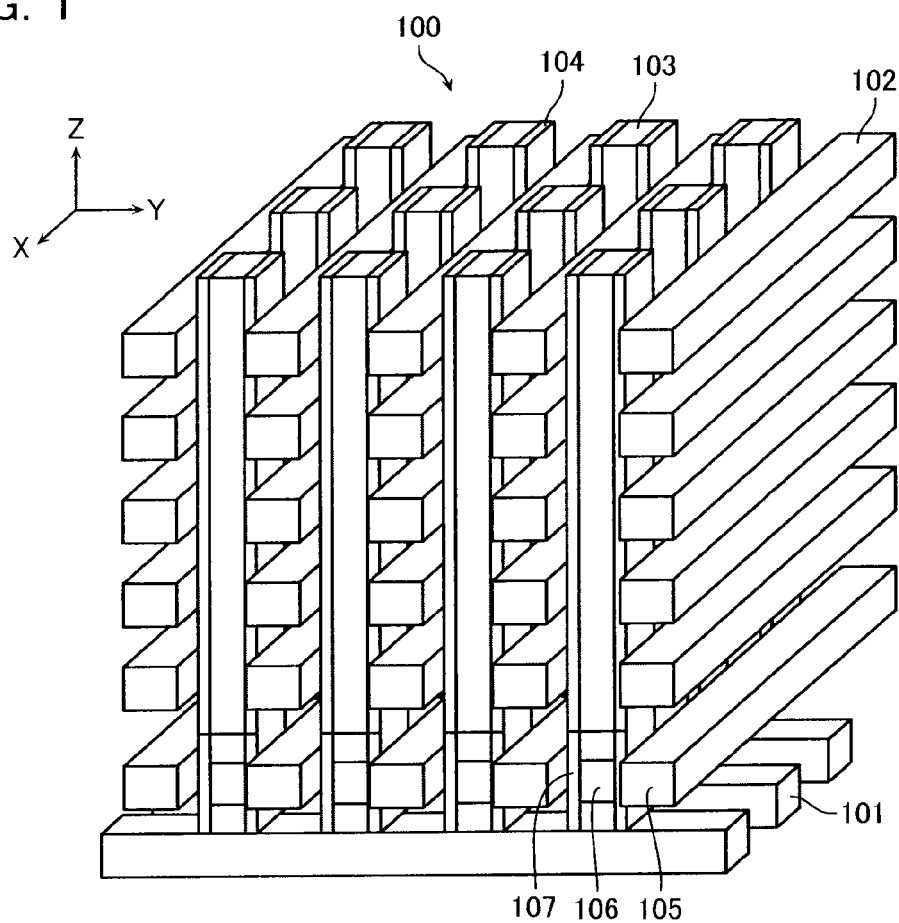
FIG. 1 is an example of a perspective view showing a memory cell array of a memory device according to a first embodiment.
Figure 2:
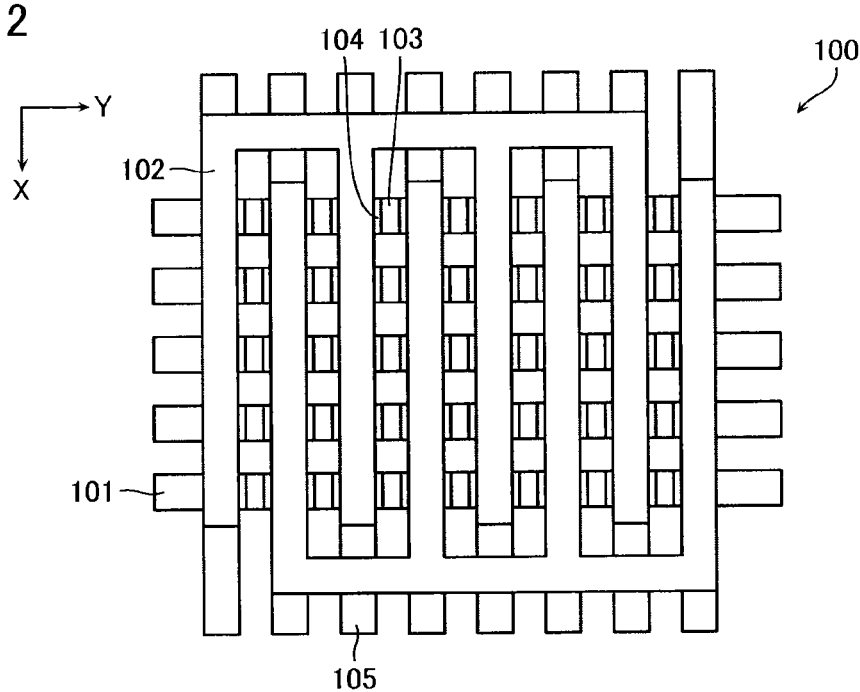
FIG. 2 is an example of a top view showing a structure of the memory cell array of the memory device according to same embodiment.

FIG. 1 is an example of a perspective view showing the structure of the memory cell array of the memory device according to the present embodiment, and FIG. 2 is an example of a top view showing the structure of same memory cell array. In FIGS. 1 and 2, an X direction, a Y direction, and a Z direction are shown as three directions intersecting each other.

The memory cell array 100 of three-dimensional structure includes global column lines 101 aligned in the X direction and extending in the Y direction, and row lines 102 aligned in a two-dimensional array shape in the Y direction and the Z direction and extending in the X direction. Furthermore, the memory cell array 100 includes column lines 103 aligned in a two-dimensional array shape in the X direction and the Y direction and extending in the Z direction. Each of the column lines 103 is disposed on the global column line 101 between the row lines 102 adjacent in the Y direction as viewed from the Z direction. Disposed between each of the row lines 102 and each of the column lines 103 is a resistance varying material 104, and disposed at connections of the global column line 101 and each of the column lines 103 is a selection element that includes a gate line 105 extending in parallel to the row line 102, a silicon portion 106, and a gate insulating film 107. The global column line 101 and each of the column lines 103 are electrically connected by this selection element. Now, in imitation of an ordinary MOS type cell, the global column line 101, the row line 102, and the column line 103 are sometimes also respectively called a "global bit line", a "word line", and a "bit line". Furthermore, the gate line 105 of the selection element is sometimes also called a "sheet selector".

In the case of such a structure, the word lines 102 and the bit lines 103 of the memory cell array 100 has a simple line-and-space pattern, has a positional relationship of the word line 102 and the bit line 103 being orthogonal, and may be formed without consideration of misalignment in the X direction and the Z direction. Therefore, an alignment accuracy in the cell during manufacturing can be relaxed, whereby the memory cell array 100 can be easily formed. Moreover, a region of memory cell unit is $2F^2$ at this structure, then this structure can have information of as many bits as the number of layers. Then, it is possible to have a highly degree of integration.

Note that as shown in FIG. 2, the word lines 102 of FIG. 1 configure a "word line comb" having every other line alternately comb-shaped, and the word lines of each of the word line combs are electrically provided with an identical voltage.

In addition, the resistance varying material 104 typified by HfO is capable of transition between at least two resistance states, namely a low-resistance state and a high-resistance state. The resistance varying material 104 in a high-resistance state, when applied with a certain amount of voltage or more, undergoes transition to a low-resistance state. On the other hand, the resistance varying material 104 in a low-resistance state, when a certain amount of current or more flows therein, undergoes transition to a high-resistance state. The resistance varying material 104 may be configured by a thin film formed from one of materials such as $TiO_2$, $ZnMn_2O_4$, NiO, $SrZrO_3$, $Pr_{0.7}Ca_{0.3}MnO_3$, and carbon, besides HfO.

Additionally, the following may be employed in the resistance varying material 104, namely Si in a polycrystalline or amorphous state, or Ge, SiGe, GaAs, InP, GaP, GaInAsP, GaN, SiC, SiO, SiON, SiN, HfSiO, AlO, and so on. Moreover, a stacked film of the above-mentioned materials may be used as the resistance varying material 104. Furthermore, an electrode may be disposed between the resistance varying material 104 and the bit line 103, the electrode being of, for example, Ag, Au, Ti, Ni, Co, Al, Fe, Cr, Cu, W, Hf, Ta, Pt, Ru, Zr or Ir, or a nitride or carbide of these elements, and so on. Moreover, a material having the above-described materials added to polycrystalline silicon may be used as the electrode.

Hereinafter, a variable resistance in a high-resistance state undergoing transition to a low-resistance state is sometimes called a "setting operation"; the variable resistance in a low-resistance state undergoing transition to a high-resistance state is sometimes called a "resetting operation"; performing the setting operation or the resetting operation on the resistance varying material, that is, writing data to the cell is sometimes called a "write operation"; detecting a resistance state of the resistance varying material, that is, reading data of the cell is sometimes called a "read operation"; and performing the setting operation and the resetting operation with a voltage application of a different polarity to the cell is sometimes called a "bipolar operation".

Next, a data processing system of the memory device according to the present embodiment will be described.

Figure 3:
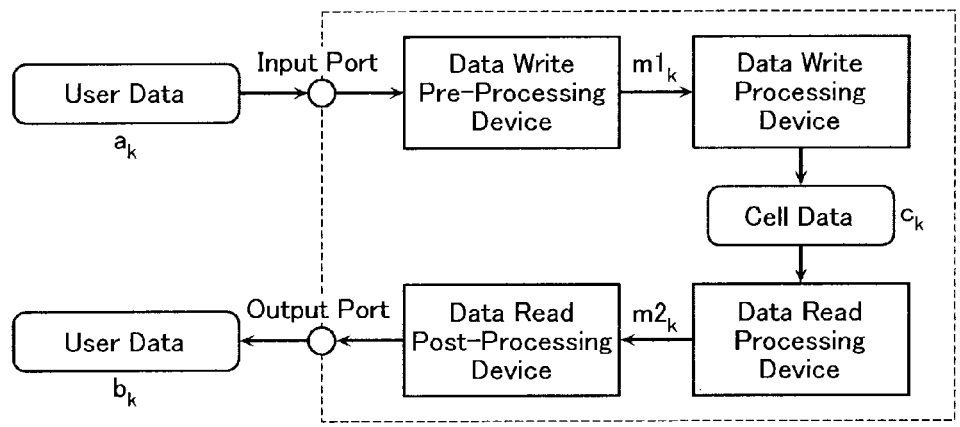
FIG. 3 is an example of a circuit block diagram of a data processing system in the memory device according to same embodiment.

FIG. 3 is an example of a circuit block diagram of the data processing system in the memory device according to the present embodiment.

The data processing system of the memory device of the present embodiment includes: an input port that has user data $a_k$ inputted thereto from external; a data write pre-processing circuit that pre-processes the user data $a_k$ inputted via the input port to generate intermediate data $m1_k$ (first intermediate data); a data write processing circuit that writes the intermediate data $m1_k$ outputted from the data write pre-processing circuit to the cell; a data read processing circuit that reads cell data $C_k$ stored by the cell and processes the cell data $C_k$ to generate intermediate data $m2_k$ (second intermediate data); a data read post-processing circuit that post-processes the intermediate data $m2_k$ outputted from the data read processing circuit to generate user data $b_k$; and an output port that outputs the user data $b_k$ outputted from the data read post-processing circuit.

In the present embodiment, the data write pre-processing circuit is provided before the data write processing circuit, and the data read post-processing circuit is provided after the data read processing circuit. Moreover, in the case of the memory device of the present embodiment, the inputted/outputted user data $a_k$ and $b_k$ are different from the cell data $c_k$ ($a_k = b_k \neq c_k$).

Figure 4:
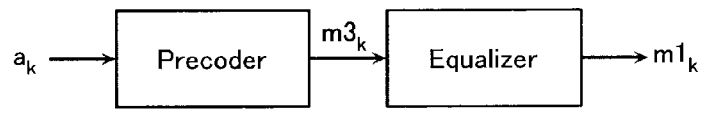
FIG. 4 is an example of a circuit block diagram of a data write pre-processing circuit of the memory device according to same embodiment.
Figure 5:
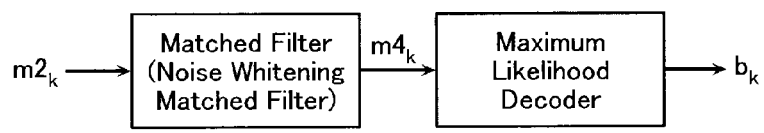
FIG. 5 is an example of a circuit block diagram of a data read post-processing circuit of the memory device according to same embodiment.

FIG. 4 is an example of a circuit block diagram of the data write pre-processing circuit of the memory device according to the present embodiment, and FIG. 5 is an example of a circuit block diagram of the data read post-processing circuit of the memory device according to the present embodiment.

In the case of the example of the data write pre-processing circuit of FIG. 4, the user data $a_k$ is converted to intermediate data $m3_k$ (third intermediate data) based on a later-described fixed rule, by a circuit called a precoder, and then undergoes a processing that corrects a waveform change in a later data write processing, by a following waveform equalizer (hereinafter, sometimes also called an "equalizer"). In the case of the data read post-processing circuit of FIG. 5, the intermediate data $m2_k$ outputted from the data read processing circuit has a correlation of read noise whitened (randomized) to generate intermediate data $m4_k$ (fourth intermediate data), by a circuit called a whitening matched filter (hereinafter, sometimes also called a "matched filter"), and is then converted to the original user data $b_k$, by a following maximum likelihood decoder. The maximum likelihood decoder is a circuit that, instead of performing a determination of data values stored by individual cells based on each cell current value with a constant threshold as reference, incorporates as determination information a state transition probability of a series of data stored by cells to determine a data value sequence that seems most likely of the overall series of data. The maximum likelihood decoder may use a circuit called a Viterbi decoder, for example.

A specific example where interference between cell data can be suppressed will be described using the memory device mounted with a function or mechanism of the data write processing circuit, the cell data $C_k$, and the data read processing circuit of FIG. 3.

Figure 6:
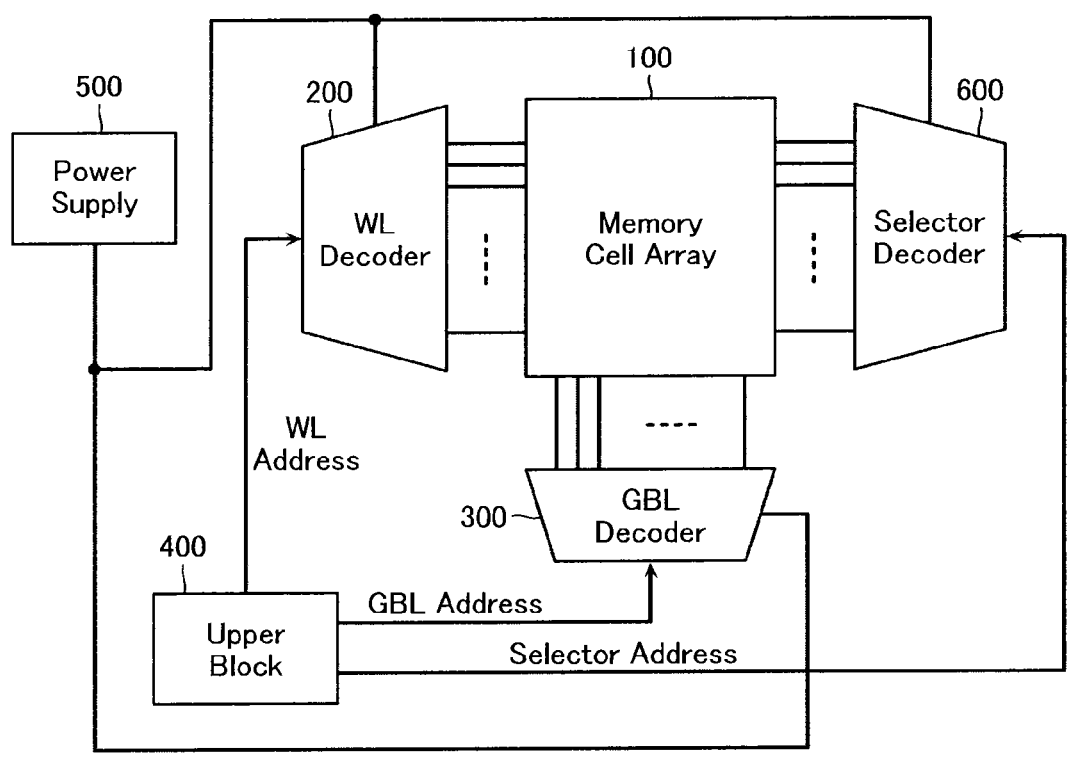
FIG. 6 is an example of a functional block diagram of the memory device according to same embodiment.

FIG. 6 is an example of a functional block diagram of the memory device according to the present embodiment.

Figure 7:
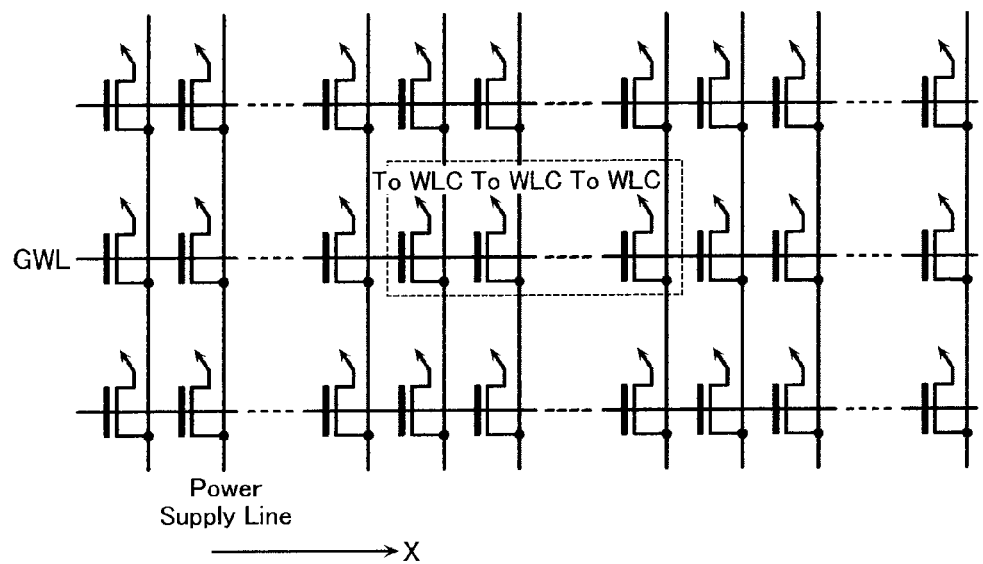
FIG. 7 is an example of a circuit diagram of a global word line of the memory cell array of the memory device according to same embodiment.

Connected to each of the word lines 102 (WL) of the memory cell array 100 is a WL decoder 200. The WL decoder 200 can perform selection/non-selection of a desired word line by two-dimensional decoding with a source line and a global word line as a control line. Note that a global word line GWL can be configured by commonly connecting gate lines of transistors configuring drivers, and is a line extending in the same direction as the word line in the chip (refer to FIG. 7). In addition, connected to each of the global bit lines 101 (GBL) of the memory cell array 100 is a GBL decoder 300 including a driver having a function of the write operation and the read operation. Furthermore, connected to the gate lines 105 of each of the selection elements is a selector decoder 600. The WL decoder 200, the GBL decoder 300, and the selector decoder 600 select the global bit line 101, the word line 102, and the gate line 105 electrically connected to the cell that is to be a target of the write operation or the read operation in the memory cell array 100, based on address information ("WL address", "GBL address", and "selector address" of FIG. 6) from an upper block 400.

Hereinafter, the cell that is to be a target of the write operation or the read operation is sometimes also called a "selected cell"; the other cells are sometimes also called "unselected cells"; the global bit line 101, the word line 102, the bit line 103, and the gate line 105 that are electrically connected to the selected cell are sometimes respectively called a "selected global bit line", a "selected word line", a "selected bit line", and a "selected gate line"; and other global bit lines 101, word lines 102, bit lines 103, and gate lines 105 are sometimes respectively called "unselected global bit lines", "unselected word lines", "unselected bit lines", and "unselected gate lines". Moreover, the unselected cell electrically connected to any one of the selected word line and the selected bit line is sometimes also called a "half-selected cell".

A power supply 500 generates a later-described combination of certain voltages corresponding to the write operation or the read operation, sends a bias voltage of the selected word line 102 and a bias voltage of the unselected word line 102 to the WL decoder 200, and sends a bias voltage of the selected global bit line 101 and a bias voltage of the unselected global bit line 101 to the GBL decoder 300. In addition, the power supply 500 sends a select gate line voltage to the selector decoder 600. Such a configuration makes possible the write operation and the read operation on a certain cell in the memory cell array 100.

Note that the data write pre-processing circuit and the data read post-processing circuit of FIG. 3 are included in the upper block 400.

Figure 8:
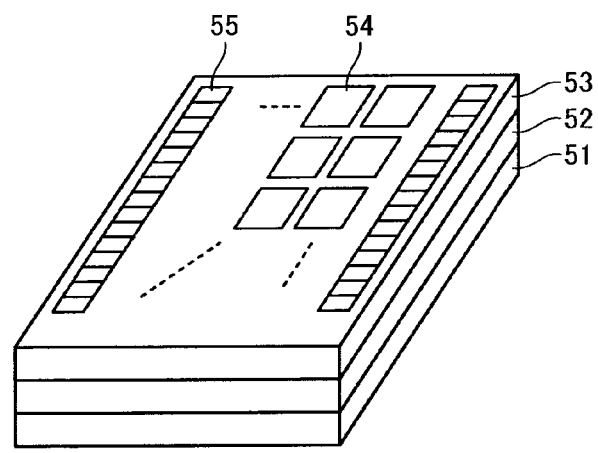
FIG. 8 is an example of a perspective view showing an overall structure of the memory device according to same embodiment.

FIG. 8 is an example of a perspective view showing an overall structure of the memory device according to the present embodiment.

Formed on an ordinary semiconductor substrate 51 by an ordinarily employed process is a CMOS circuit 52 including a wiring line layer, and formed on this CMOS circuit 52 is a layer 53 including a plurality of memory cell units 54. The memory cell units 54 of FIG. 8 each correspond to the memory cell array 100 shown in FIG. 6, and wiring lines are formed in each of the memory cell units 54 by a design rule of, for example, 20 nm. Moreover, the WL decoder 200, the GBL decoder 300, and the selector decoder 600, along with peripheral circuits such as the upper block 400 of FIG. 6 are included in the CMOS circuit 52 of FIG. 8.

Note that the CMOS circuit 52 is more relaxed than the wiring line of the memory cell unit 54 excluding a connecting unit with the memory cell unit 54, and is designed and manufactured by a 90 nm design rule, for example. Formed in a periphery of each of the memory cell units 54 is an electrical connecting unit with the CMOS circuit 52. Moreover, blocks are disposed in a matrix on the layer 53 including the memory cell unit 54, one block being a gathering of the memory cell unit 54 and the peripheral electrical connecting unit. Furthermore, an end of the layer 53 including the memory cell unit 54 is provided with an input/output unit 55 of the memory device, the input/output unit 55 being electrically connected to an input/output unit of the CMOS circuit 52 via a conductor filling a through-hole.

Such a configuration makes it possible for a portion corresponding to a protective film of the CMOS circuit 52 to work as an insulating film formed on the memory cell unit 54. Also, since the memory cell unit 54 and the CMOS circuit 52 are joined in a vertical direction, advantages are taken on a reduction in operation time, a significant increase in the number of cells that can be simultaneously read/written, and so on, without an accompanying increase in chip area. Note that the input/output unit 55 of the memory device is bonded to a lead frame in a packaging process.

Figures 9, 10:
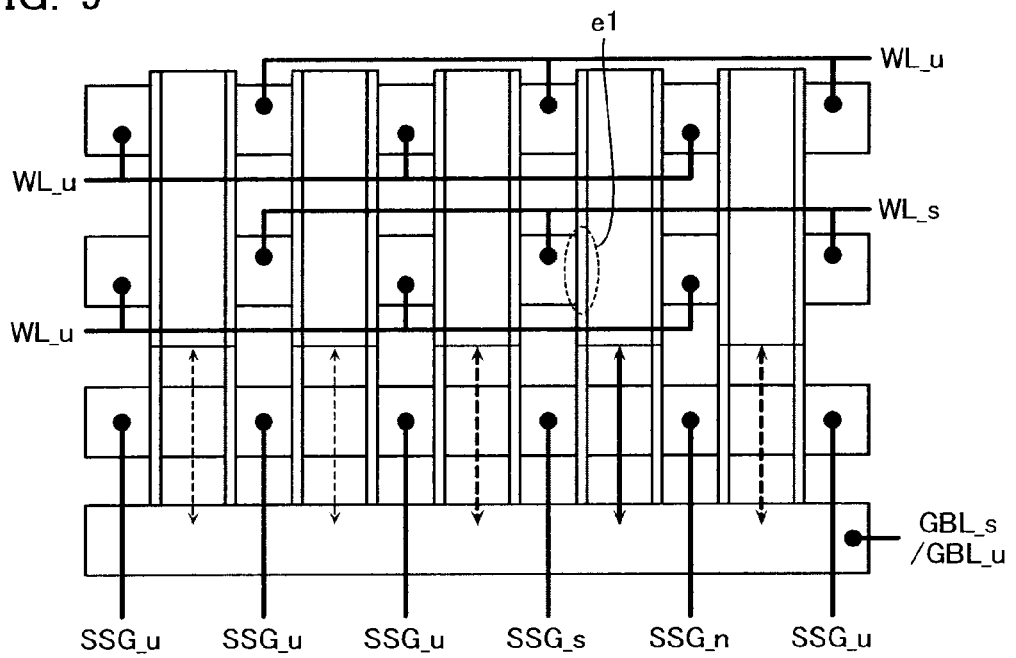
FIG. 9 is an example of a schematic view of a cross-section in the memory cell array of the memory device according to same embodiment.
FIG. 10 is an example of a table showing a bias state of the memory cell array of the memory device according to same embodiment.

FIG. 9 is an example of a schematic view of a cross-section of the memory cell array in the memory device according to the present embodiment, and FIG. 10 is an example of a table showing a bias state of same memory cell array. FIG. 10 is the table in the case where the cell shown by the broken line circle e1 of FIG. 9 is adopted as the selected cell.

During the write operation where the cell undergoes the resetting operation, a selected global bit line GBL_s is applied with a write voltage Vw, and an unselected global bit line GBL_u and an unselected word line WL_u are applied with a voltage Vwf. The voltage Vwf is a voltage causing a cell voltage of a half-selected cell to be approximately half of a cell voltage of the selected cell. In addition, a selected word line WL_s and an unselected gate line SSG_u are applied with 0 V, and both of gate lines SSG_s and SSG_n of the selection element connected to the selected bit line are applied with a write selected gate voltage Vg_w. Putting the memory cell array 100 in this bias state causes the selected cell to be in a high-resistance state (resetting operation).

On the other hand, during the write operation where the cell undergoes the setting operation, in view of the bipolar operation, the selected word line WL_s is applied with a voltage (Ves+Vof) which is another write voltage Ves having an offset voltage Vof (for example, about 1 V) added thereto, and the unselected global bit line GBL_u and the unselected word line WL_u are applied with a voltage (Vef+Vof). The voltage (Vef+Vof) is a voltage causing a cell voltage of a half-selected cell to be approximately half of a cell voltage of the selected cell. The selected global bit line GBL_s is applied with the offset voltage Vof. In addition, the unselected gate line SSG_u is applied with 0 V, and both of the gate lines SSG_s and SSG_n of the selection element connected to the selected bit line are applied with another write selected gate voltage Vg_e. Putting the memory cell array 100 in this bias state causes the selected cell to be in a low-resistance state (setting operation).

Now, the reason why the voltages of the global bit lines GBL and the word lines WL are added to the offset voltage Vof of about 1 V is as follows. It is because in view of later-described characteristics of the selection element, setting a potential of the selected global bit line GBL_s to a value about 1 V higher than that of the unselected gate line SSG_u enables a leak current to the unselected cell to be significantly reduced. In addition, in order to obtain a certain potential difference without employing a negative voltage circuit by which a required area of the circuit becomes large, it is effective to lift up an overall voltage of the global bit lines GBL and the word lines WL.

Furthermore, during the read operation, the selected global bit line GBL_s, the unselected global bit line GBL_u, and the unselected word line WL_u are applied with a voltage (Vr+Vo) which is a read voltage Vr having an offset voltage Vo added thereto, and the selected word line WL_s is applied with the offset voltage Vo. Putting the memory cell array 100 in this bias state and controlling the voltage of the gate lines SSG_s and SSG_n causes read of information from the cell to be performed.

Now, the reason why the voltages of the global bit lines GBL and the word lines WL are added to the offset voltage Vo is as follows. Usually, immediately after the write operation on a certain cell is performed, a read operation on said cell is performed to confirm whether said cell has attained a target resistance value, and if said cell is in a range different from that of the target resistance value, an additional write operation is performed. Now, a large voltage difference exists between bias conditions during the write operation and bias conditions during the read operation. Moreover, performing an operation where there is a large voltage change of a node having large parasitic capacitance results in an unnecessary increase in power consumption and/or delay of operation time. In the case of the present embodiment, the parasitic capacitance of the global bit line GBL is largest, hence the voltage of the global bit line GBL during the write operation and the read operation is preferably set as close as possible. Even more preferably, the offset voltage Vo should be individually set such that during the resetting operation, the voltage Vwf and the voltage (Vr+Vo) are substantially equal, and during the setting operation, the voltage (Vef+Vof) and the voltage (Vr+Vo) are substantially equal, since the number of the unselected global bit lines GBL_u is larger than the number of the selected global bit lines GBL_s, and therefore preventing the large potential change of the unselected global bit lines GBL_u works more effectively.

Note that usually, only one selected word line comb belonged to by selected word line WL_s is selected in the memory cell array 100, but the selected global bit lines GBL_s may be simultaneously selected. As a result, the number of selected cells where the write operation and the read operation can be simultaneously performed increases, hence band width can be improved.

Next, an example will be described in case that interference between cell data may occur due to the bias states during the write operation and the read operation described using FIGS. 9 and 10.

Figure 11:
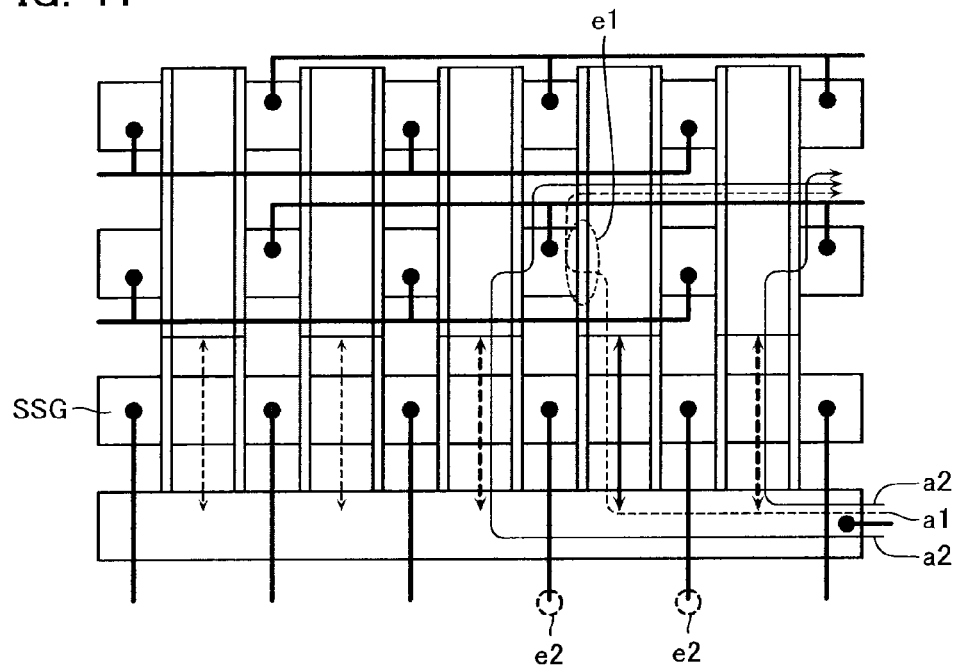
FIG. 11 is an example of a schematic view of a cross-section of the memory cell array explaining interference between cell data in the memory device according to same embodiment.
Figure 12:
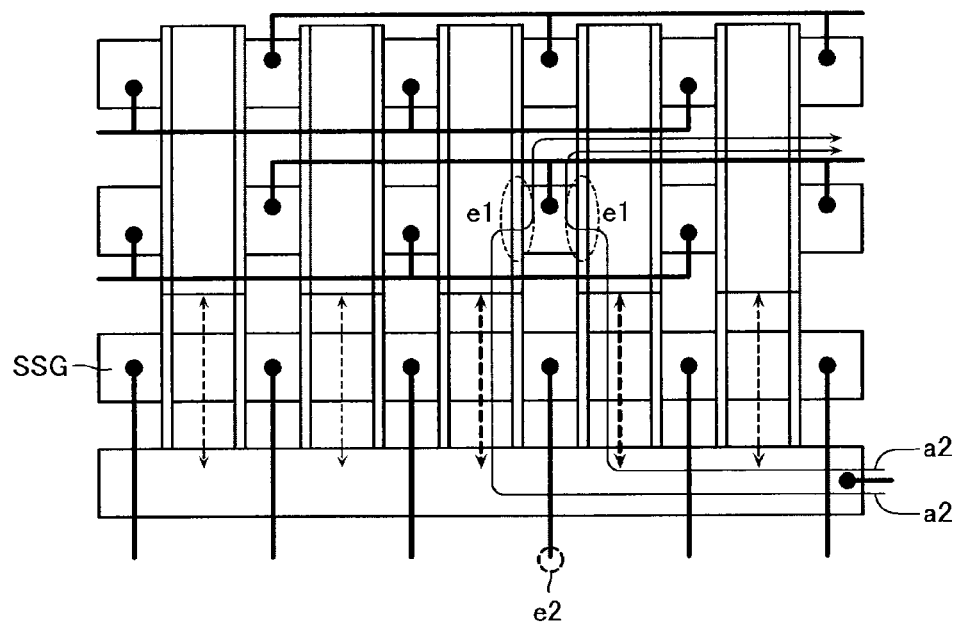
FIG. 12 is an example of a schematic view of a cross-section of the memory cell array explaining interference between cell data in the memory device according to same embodiment.
Figure 13:
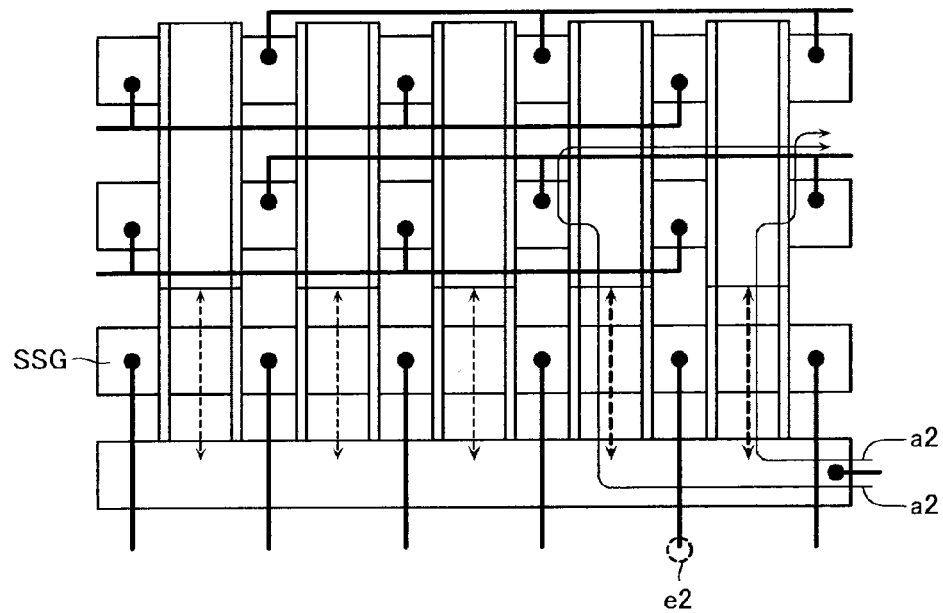
FIG. 13 is an example of a schematic view of a cross-section of the memory cell array explaining interference between cell data in the memory device according to same embodiment.

FIGS. 11 to 13 are each an example of a schematic view of a cross-section of the memory cell array explaining interference between cell data in the memory device according to the present embodiment.

Since the selection element shares the gate line SSG with both adjacent selection elements, then the selection elements include not only a selected selection element where the gate lines SSG on both sides are selected gate lines and an unselected selection element where the gate lines SSG on both sides are unselected gate lines, but also a half-selected selection element where the gate line SSG on one side only is a selected gate line. As a result, as shown in FIG. 11, not only does the selected cell (cell shown by the broken line circle e1 of FIG. 11) connected to the selected selection element having the selected gate lines SSG_s and SSG_n (gate lines shown by the broken line circles e2 of FIG. 11) on both sides have a cell current (current traversing the path shown by arrow a1 of FIG. 11) flowing therein, but also cells having an adjacent address to the selected cell have a certain extent of cell current (current traversing the paths shown by arrows a2 of FIG. 11) flowing therein. Therefore, when the write operation to the selected cell is performed, a cell current flows also in the cells adjacent to the selected cell, whereby interference between cell data may sometimes occur. In addition, as shown in FIGS. 12 and 13, when one gate line (gate line shown by the broken line circle e2 of FIGS. 12 and 13) is adopted as the selected gate line SSG_s or SSG_n, the two adjacent selection elements sharing this selected gate line SSG_s or SSG_n become half-selected, and a cell current (current traversing the paths shown by arrows a2 of FIGS. 12 and 13) flows simultaneously in the two cells having adjacent addresses, whereby interference between cell data may sometimes occur.

Figure 14:
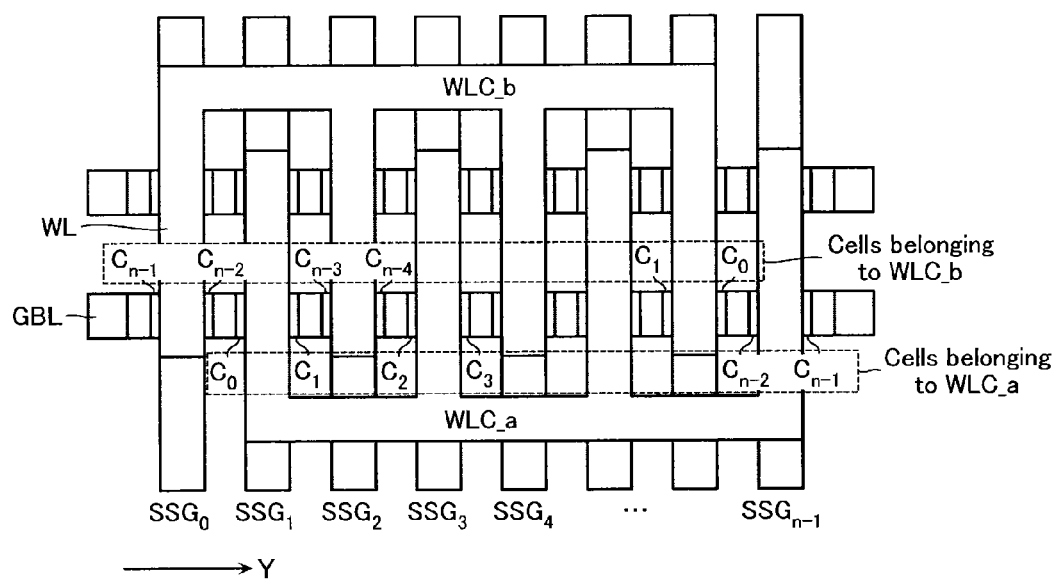
FIG. 14 is an example of a top view of part of the memory cell array of the memory device according to same embodiment.
Figure 15:
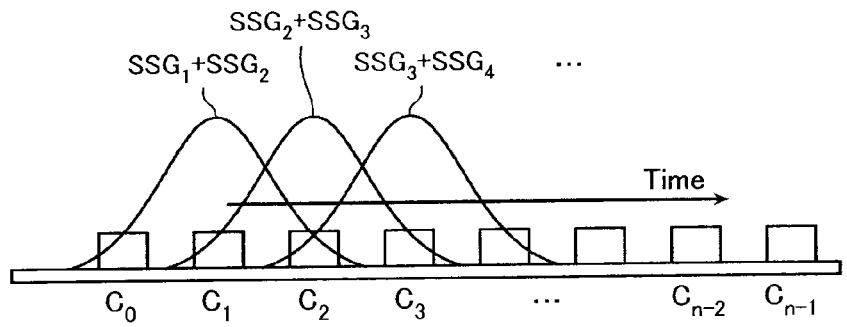
FIG. 15 is an example of a schematic view of a cell address and a pulse waveform applied to a cell during a write operation in the memory device according to same embodiment.
Figure 16:
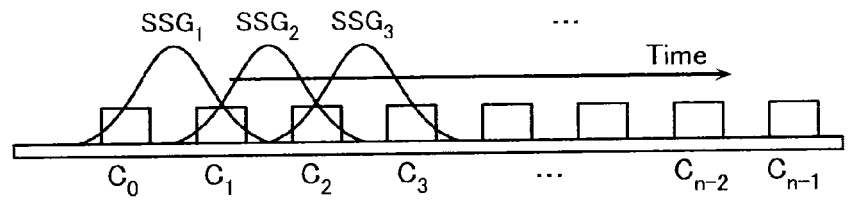
FIG. 16 is an example of a schematic view of a cell address and a pulse waveform applied to a cell during a read operation in the memory device according to same embodiment.

FIGS. 14 to 16 are views explaining the above-described interference between cell data from a different perspective. FIG. 14 is an example of a top view of part of the memory cell array of the memory device according to the present embodiment. FIG. 14 shows also an address of a cell belonging to one word line comb WLC on one global bit line GBL. FIG. 15 is an example of a schematic view of a cell address and a pulse waveform applied to a cell during the write operation in same memory device. FIG. 16 is an example of a schematic view of a cell address and a pulse waveform applied to a cell during the read operation in same memory device.

In the case of the write operation, switching of selection of the gate line SSG is performed synchronized with a constant clock cycle. In other words, the gate line SSG is selected in order of, for example, $(SSG_0+SSG_1) \rightarrow (SSG_1+SSG_2) \rightarrow (SSG_2+SSG_3) \rightarrow \ldots \rightarrow (SSG_{n-1}+SSG_n)$. It should be noted that the gate line $SSG_n$ is physically an identical line to the gate line $SSG_0$ of an adjacent word line comb. At this time, a voltage difference between the selected global bit line GBL and the selected word line WL at each step determines a height of a pulse applied to the cell. Assuming that at each of steps $(SSG_1+SSG_2)$, $(SSG_2+SSG_3)$, and $(SSG_3+SSG_4)$, a pulse of the same height is applied, then as shown in FIG. 15, the situation arises that a pulse having a spread is applied sequentially in time to three adjacent cells. For example, during the step $(SSG_1+SSG_2)$, a pulse is applied to cells $C_0$, $C_1$, and $C_2$. This situation may be regarded as equivalent to the situation where, in communication technology, interference between data is occurring between adjacent signals like as communication speed is speeded up.

Similarly in the case of the read operation, switching of selection of the gate line SSG is performed synchronized with a constant clock cycle. In other words, the gate line SSG is selected in order of, for example, $(SSG_0) \rightarrow (SSG_1) \rightarrow (SSG_2) \rightarrow \ldots \rightarrow (SSG_{n-1})$. In the case of the read operation, since the voltage difference between the selected global bit line GBL and the selected word line WL is set substantially constant and a current flowing in the selected global bit line GBL is detected, then as shown in FIG. 16, the situation arises that signals of two cells adjacent in a direction of extension of the global bit line GBL are detected sequentially overlapped in time. For example, during the step $(SSG_1)$, signals of the cells $C_0$ and $C_1$ are detected overlapped. This situation too may be regarded as equivalent to the situation where, in communication technology, interference between data is occurring between adjacent signals as communication speed is speeded up.

Moreover, in the cases of both the write operation and the read operation, during switching of the voltage of the gate line or during switching of the selected word line voltage or the selected global bit line voltage (voltage difference between the selected word line WL_s and the selected global bit line GBL_s), switching is performed sequentially without sandwiching a so-called settling time, hence data transfer speed can be speeded up.

Note that in the case of the structure of the memory cell array 100 of FIGS. 1 and 2, usually, parasitic capacitance and resistance of the global bit line 101 is larger than parasitic capacitance and resistance of the word line 102, and a time constant with respect to voltage change is also larger. As a result, when switching the voltage difference between the selected word line 102 and the selected global bit line 101, it is preferable to switch the voltage of the selected word line 102 in a state where the voltage of the selected global bit line 101 is set constant. This leads to an advantage that speeding up can be more easily.

Next, interference between cell data will be described using a simple specific example.

The case of interference between cell data of 1:1 between adjacent cells occurring only during the read operation, will be dealt with here. In other words, it is assumed that during the write operation, interference between cell data between adjacent cells is not present. In this case, the data write pre-processing circuit in FIG. 3 performs data conversion such that user data values $(a_0, a_1, a_2, \ldots, a_{n-1})$ and cell data values $(c_0, c_1, c_2, \ldots c_{n-1})$ actually written to the cells attain a relationship of $c_0=a_0$, $c_{k+1}=a_{k+1}-c_k$. However, in calculation of the present embodiment, in cases where a result is negative or a result is a (maximum value of data value+1) or more, the (maximum value of data value+1) undergoes addition or subtraction. In other words, mathematically speaking, a calculation of mod (maximum value of data value+1) is performed. For example, in the case where a data value is 2-level (a binary number of 0 and 1) and the calculation result is −1, a calculation result of 1, that is, the calculation result −1 having 2 added thereto, is assumed. Similarly, in the case where the calculation result is 2, a calculation result of 0, that is, the calculation result 2 having 2 subtracted therefrom, is assumed. Moreover, in the case where the cell is a multi-level storage cell, for example, in the case where the data value has 4 levels of {0, 1, 2, 3}, 4 is added or subtracted to/from the calculation result, whereby the calculation result is set to any of {0, 1, 2, 3}.

Now, as shown in FIG. 14, it is assumed that the cell $C_0$ is an outside cell belonging to the word line WL at an end of each word line comb WLC, and is a cell directly facing the other word line comb WLC via bit line and another cell. By so doing, in the case shown in FIG. 14, selecting the gate line $SSG_0$ enables the cell data value $c_0$ of the cell $C_0$ alone to be read without interfering with other cells. Then, the user data value $a_0$ is read from the previously-mentioned relational expression $c_0=a_0$ of data conversion.

In addition, the cells $C_1, C_2, \ldots, C_{n-1}$ belonging to the word line comb WLC a are aligned in a positive direction in the Y direction sequentially from the cell $C_0$. Moreover, the cells $C_0$ and $C_1$ are disposed facing the same word line WL. Similarly, the cells $C_2$ and $C_3$, the cells $C_4$ and $C_5, \ldots$, the cells $C_{n-2}$ and $C_{n-1}$ are disposed facing the same word line WL.

Moreover, as shown in FIG. 16, when the gate line $SSG_1$ and following gate lines are sequentially selected in the manner of $(SSG_1) \rightarrow (SSG_2) \rightarrow \ldots \rightarrow (SSG_{n-1})$, the cell data values $(c_0+c_1) \rightarrow (c_1+c_2) \rightarrow \ldots \rightarrow (c_{n-2}+c_{n-1})$ are sequentially read. Then, since $a_{k+1}=c_{k+1}+c_k$ holds true from the previously-mentioned relational expression of data conversion, the user data values $(a_1) \rightarrow (a_2) \rightarrow \ldots \rightarrow (a_{n-1})$ are sequentially read. Note that in this calculation too, in cases where a result is negative or a result is a (maximum value of data value+1) or more, the (maximum value of data value+1) undergoes addition or subtraction. In other words, mathematically speaking, a calculation of mod(maximum value of data value+1) is performed. For example, in the case where a data value is 2-level (a binary number of 0 and 1) and the calculation result is −1, a calculation result of 1, that is, the calculation result −1 having 2 added thereto, is assumed. Similarly, in the case where the calculation result is 2, a calculation result of 0, that is, the calculation result 2 having 2 subtracted therefrom, is assumed. Moreover, in the case where the cell is a multi-level storage cell, for example, in the case where the data value has 4 levels of {0, 1, 2, 3}, 4 is added or subtracted to/from the calculation result, whereby the calculation result is set to any of {0, 1, 2, 3}.

Now, data processing during the read operation when noise is present will be described. Note that noise described here is assumed to include also physical resistance fluctuation of the cell. In conventional data processing during the read operation, even in the case where noise is present, when, for example, a read cell data value is {0, 1}, a threshold is simply set to 0.5, and if 0.5 or less, a data value {0} is determined, and if larger than 0.5, a data value {1} is determined. In the case where read cell data values are {0, 1, 2}, thresholds are set to 0.5 and 1.5, and if 0.5 or less, a data value {0} is determined, if larger than 0.5 and no more than 1.5, a data value of {1} is determined, and if larger than 1.5, {2}=data value {0} is determined.

In contrast, in an example of the present embodiment, a Viterbi algorithm is applied to data processing during the read operation. In other words, a state transition probability of data is incorporated as determination information, and a data value sequence that seems most likely of an overall series of data is determined. Generally, it is random whether the user data value $a_k$ is {0} or {1}, and it is also random whether $a_{k+1}$ is {0} or {1} when $a_k$ is {0} or whether $a_{k+1}$ is {0} or {1} when $a_k$ is {1}, all probabilities being ½. In this connection, the cell data value $c_k$ which is the conversion result of the user data value $a_k$ described using FIG. 3 is also random. However, even if the user data value $a_k$ is random, a state transition of the read cell data value $(c_k+c_{k-1})$ includes a transition that in principle is not permitted. For example, in the case when $(c_k+c_{k-1})$ is (0), the following $(c_{k+1}+c_k)$ can never be {2}. Using this unpermitted transition information enables determination precision of data to be raised.

Specifically, in FIG. 3, the data read post-processing circuit performs a selection on information $(c_0) \rightarrow (c_0+c_1) \rightarrow (c_1+c_2) \rightarrow \ldots \rightarrow (c_{n-2}+c_{n-1})$ received sequentially from the data read processing circuit, the selection selecting the most likely one from among possible state transitions. The data read post-processing circuit, in order to perform calculation in a practical range, expresses likelihood by a logarithm of probability. Its algorithm employs a likelihood of state transition path that maximize $P_{k-1}+B_k$, where $P_{k-1}$ is a likelihood of a state transition path at a stage up to a previously-mentioned data sequence of k−1 and $B_k$ is a likelihood of a state transition at a stage of a data sequence of k, which means $P_k$ is a likelihood of a new state transition path for proceeding to the next stage and equal to $P_{k-1}+B_k$. This algorithm allows determination of a data value to be executed by calculation of recursive addition, magnitude comparison, and selection.

That is, first, a working memory of the arithmetic circuit is initialized, and then $B_0=P_0$ is calculated based on information $(c_0)$ received from the data read processing circuit. Next, $B_1$ is calculated based on information $(c_0+c_1)$ received from the data read processing circuit, and then $P_1=P_0+B_1$ corresponding to a possible state transition path is obtained by recursive addition. Next, a state transition path giving a maximum value of $P_1$ is sought by magnitude comparison, and then the most likely state transition path at this stage is selected. These processes are repeated to k=n−1, and a final most likely state transition path is determined and adopted as an output of the data read post-processing circuit. Note that when the write operation and the read operation are performed in a large unit such as, for example, a unit referred to as a page, an address needs only to be sequentially shifted to a following word line comb WLC or a following global bit line GBL, and the above-described loop repeats from initialization of the working memory.

Figure 17:
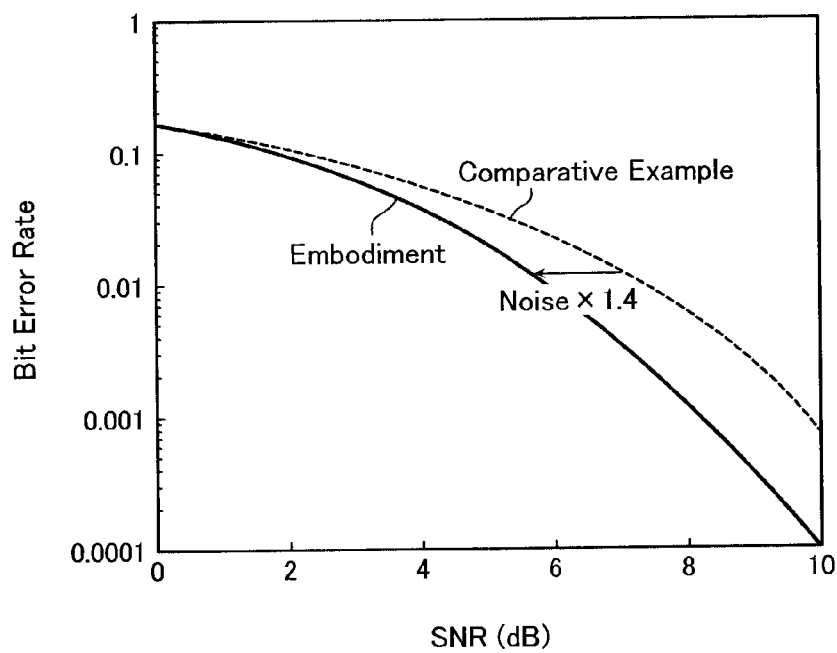
FIG. 17 is an example of a characteristic diagram showing dependency of bit error rate on SNR during the read operation in the memory device according to same embodiment.

Results of the above-described series of examples simulated with a random noise system are shown in FIG. 17. FIG. 17 is an example of a characteristic diagram showing dependency of bit error rate (BER) on SNR (logarithm of inverse of magnitude of noise) during the read operation in the memory device according to the present embodiment. As a comparative example, FIG. 17 shows also the case of data processing where interference between cell data between adjacent cells during the read operation is not present and state transition probability of data is not incorporated in determination. It may be understood from this simulation result that the BER in the case of the present embodiment, where interference between cell data between adjacent cells during the read operation is present, is better than that of the comparative example. Specifically, even when approximately 1.4 times more noise is present compared to the comparative example, the same BER as the comparative example of approximately 1% is obtained at this embodiment that the state transition probability of data is incorporated in determination. In other words, it may be clearly understood that data processing during the read operation of the present embodiment has a tolerance to noise that is improved compared to the comparative example.

Next, generalization of the data processing of the present embodiment will be described.

It is convenient to employ a matrix form of display when expanding the previously described data processing more generally. Now, with reference to FIG. 3, a relationship between the data received by the data write processing circuit and the data actually stored by the cell is described by a matrix W, and a relationship between the data stored by the cell and the data outputted by the data read processing circuit is described by a matrix R. By so doing, in the case that the data write pre-processing circuit and the data read post-processing circuit are not present, a matrix product RW is not a unit matrix and output data $b_k = RWa_k$ ends up being different data to $a_k$, which is the user data inputted to this data processing system, due to the interference between cell data as explained using FIGS. 14 to 16. Accordingly, with reference to FIG. 3, a relationship between the data received and the data outputted by the data write pre-processing circuit is described by a matrix T, and a relationship between the data received and the data outputted by the data read post-processing circuit is described by a matrix S. In this case, if a matrix product SRWT is a unit matrix, then the inputted user data $a_k$ and the outputted user data $b_k$ satisfy $b_k = SWRTa_k = a_k$, whereby both match. That is, setting the matrix T and the matrix S such that the matrix product SRWT is a unit matrix is one of the features of the present embodiment. At this time, the cell data $c_k$ generally has a different data value to the user data $a_k$ and $b_k$. Moreover, employing the matrix form leads also to an advantage that handling of a lead portion and an end portion of data becomes more clear compared to a form employing operators such as differentials.

As an example, the case will be dealt with where during the write operation, there is interference between cell data of 1:1:1 between data of three adjacent cells, and during the read operation, there is interference between cell data of 1:1 between data of two adjacent cells. In this case, matrices W and R may be described as in, for example, mathematical expression (1) and mathematical expression (2).

[Mathematical Expression 1]

$$W = \begin{pmatrix} 1 & 0 & 0 & 0 & 0 & 0 \\ 1 & 1 & 0 & 0 & 0 & 0 \\ 1 & 1 & 1 & 0 & 0 & 0 \\ 0 & 1 & 1 & 1 & 0 & 0 \\ 0 & 0 & 1 & 1 & 1 & 0 \\ 0 & 0 & 0 & 1 & 1 & 1 \end{pmatrix} \quad (1)$$

[Mathematical Expression 2]

$$R = \begin{pmatrix} 1 & 0 & 0 & 0 & 0 & 0 \\ 1 & 1 & 0 & 0 & 0 & 0 \\ 0 & 1 & 1 & 0 & 0 & 0 \\ 0 & 0 & 1 & 1 & 0 & 0 \\ 0 & 0 & 0 & 1 & 1 & 0 \\ 0 & 0 & 0 & 0 & 1 & 1 \end{pmatrix} \quad (2)$$

At this time, if the matrix S is assumed to be a unit matrix, then if the matrix T is set as in, for example, mathematical expression (3), the matrix product SRWT can be set to a unit matrix.

[Mathematical Expression 3]

$$T = \begin{pmatrix} 1 & 0 & 0 & 0 & 0 & 0 \\ -2 & 1 & 0 & 0 & 0 & 0 \\ 2 & -2 & 1 & 0 & 0 & 0 \\ -1 & 2 & -2 & 1 & 0 & 0 \\ 0 & -1 & 2 & -2 & 1 & 0 \\ 0 & 0 & -1 & 2 & -2 & 1 \end{pmatrix} \quad (3)$$

The matrices T and S can be obtained by calculation of inverse matrices of the matrices R and W based on definition. However, in many cases, data conversion can be executed employing a simpler method below, without calculating individual matrix elements one-by-one. If a matrix of data conversion is assumed to be B, then pre-conversion data $x_k$ can be employed to write post-conversion data $y_k$ as $y_k = Bx_k$. Now, the matrix B is assumed to be an inverse matrix of a matrix A. That is, it is the case where B=T, A=(RW), and S is a unit matrix. In this case, the matrix product SRWT becomes a unit matrix. As shown in FIGS. 15 and 16, in many cases, interference between cell data can be described by a lower triangular matrix configured from at most m (m≤about 5) independent elements. Therefore, the matrix A may be described as in mathematical expression (4).

[Mathematical Expression 4]

$$A = \begin{pmatrix} a_1 & 0 & 0 & 0 & \ldots & 0 \\ a_2 & a_1 & 0 & 0 & & 0 \\ \vdots & a_2 & a_1 & 0 & & 0 \\ a_m & \ldots & a_2 & a_1 & \ddots & 0 \\ 0 & \ddots & & \ddots & \ddots & 0 \\ 0 & 0 & a_m & \ldots & a_2 & a_1 \end{pmatrix} \quad (4)$$

Moreover, by definition of an inverse matrix, $Ay_k = ABx_k = x_k$ holds true, hence from a k-th row equality, mathematical expression (5) holds true.

[Mathematical Expression 5]

$$a_m y_{k-m+1} + a_{m-1} y_{k-m+2} + \ldots + a_2 y_{k-1} + a_1 y_k = x_k \quad (5)$$

This leads to mathematical expression (6).

[Mathematical Expression 6]

$$y_k = (x_k - (a_m Y_{k-m+1} + a_{m-1} y_{k-m+2} + \ldots + a_2 y_{k-1}))/a_1 \quad (6)$$

Thus, the k-th data $y_k$ after conversion can be obtained using only immediately previous m−1 items of post-conversion data, k-th input data $x_k$, and m coefficients $a_k$. In other words, in this calculation, the k-th post-conversion data $y_k$ does not require the inverse matrix B or later inputted input data. Therefore, in terms of circuitry, this calculation can be configured by m−1 stages of a simple shift register.

More generally, calculation can be executed expressing the matrix T using a product of two or more matrices, without the need to obtain the matrix T corresponding to the matrix product RW all at once as in the above-described example. Moreover, it is only required that the matrix product SRWT be an n rows by n columns unit matrix, which means as long as the matrix product SRWT can be defined, there is no need for the each matrices S, R, W, and T to be square matrices. For example, it is possible for the matrix S to be n rows by $m_1$ columns, the matrix R to be $m_1$ rows by $m_2$ columns, the matrix W to be $m_2$ rows by $m_3$ columns, and the matrix T to be $m_3$ rows by n columns.

For example, arithmetic processing that corrects data conversion R occurring in the data read processing circuit of FIG. 3 can be performed by the precoder of FIG. 4, and arithmetic processing that corrects data conversion W occurring in the data write processing circuit of FIG. 3 can be performed by the equalizer of FIG. 4.

Figure 18:
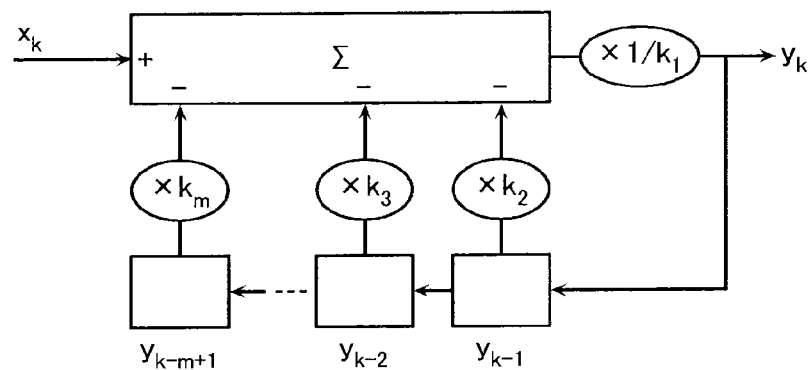
FIG. 18 is an example of a block diagram of a shift register applicable to a precoder of the memory device according to same embodiment.
Figure 19:
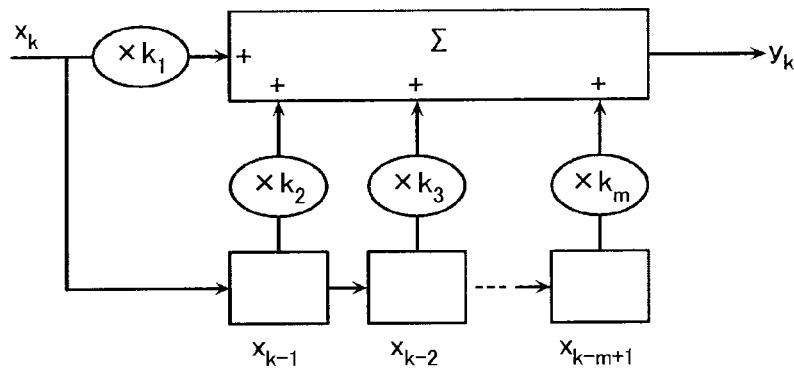
FIG. 19 is an example of a block diagram of a shift register applicable to an equalizer of the memory device according to same embodiment.
Figure 20:
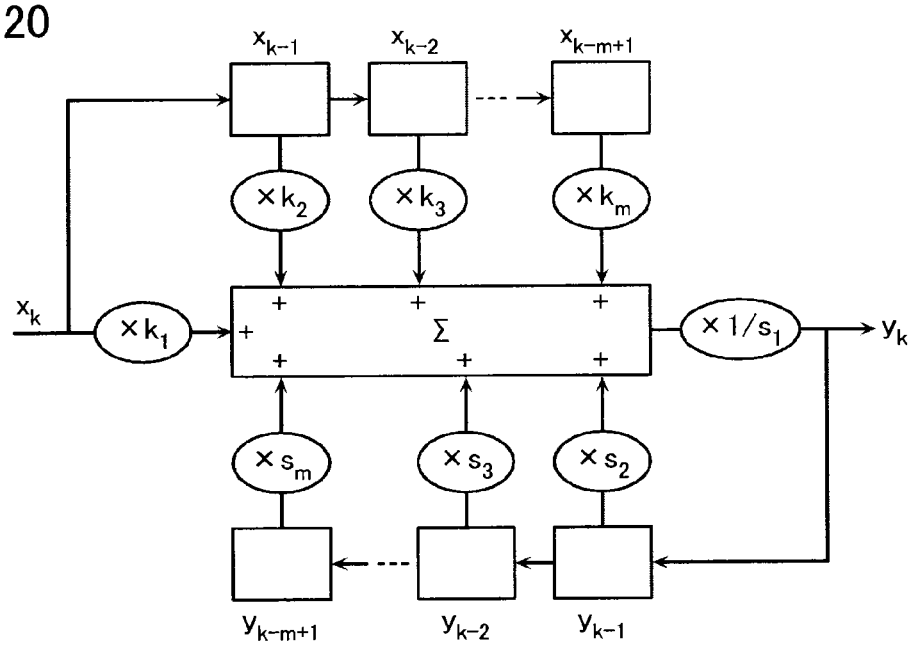
FIG. 20 is an example of a block diagram of a shift register applicable to a data write pre-processing circuit of the memory device according to same embodiment.

FIGS. 18 to 20 are examples of a block diagram of a shift register applicable to a precoder, and so on, of the memory device according to the present embodiment.

As previously mentioned, a shift register of the form shown in for example FIG. 18 may be employed in arithmetic processing of the precoder. Moreover, as is well known in signal processing technology, a shift register of the form shown in for example FIG. 19 may be employed in arithmetic processing of the equalizer. More generally, a shift register of the form shown in for example FIG. 20 may be employed in arithmetic processing of the data write pre-processing circuit. Furthermore, it is also possible for arithmetic processing of the precoder to be performed in a digital manner (integer values) and arithmetic processing of the equalizer to be performed in an analog manner (real number values).

In addition, the equalizer is capable of a more highly precise correction of the data conversion W, by performing correction also in an intermediate state between time series data in addition to the cycle of the series data.

Figure 21:
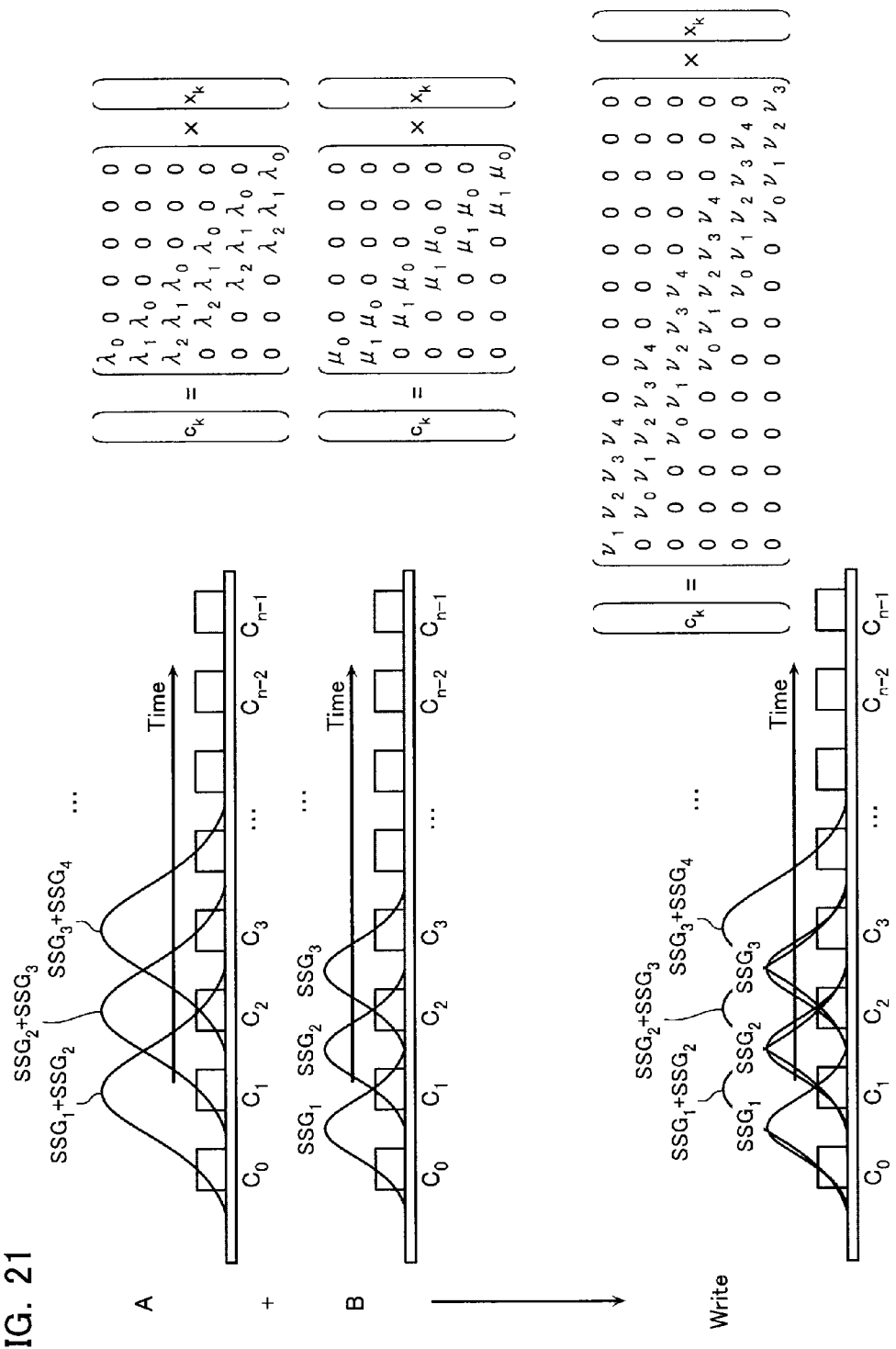
FIG. 21 is an example of a schematic view showing a cell address and a pulse waveform applied to a cell during the write operation in the memory device according to same embodiment.

FIG. 21 is an example of a schematic view showing a cell address and a pulse waveform applied to a cell during the write operation in the memory device according to the present embodiment. This FIG. 21 applies the previously mentioned technology and is an example of a write operation that performs correction of an intermediate state using the previously mentioned non-square matrix.

In the case where correction of the intermediate state is not performed, as previously mentioned, the gate line SSG is sequentially selected thereof switched in order of, for example, $(SSG_0+SSG_1) \rightarrow (SSG_1+SSG_2) \rightarrow (SSG_2+SSG_3) \rightarrow \ldots \rightarrow (SSG_{n-1}+SSG_n)$, while the selected cell is synchronously supplied with a pulse from the selected word line WL_s. It should be noted that the gate line $SSG_n$ is physically an identical line to the gate line $SSG_0$ of an adjacent word line comb. In contrast, in the case where correction in the equalizer is performed also in the intermediate state, the gate line SSG is sequentially selected thereof switched in order of, for example, $(SSG_0) \rightarrow (SSG_0+SSG_1) \rightarrow (SSG_1) \rightarrow (SSG_1+SSG_2) \rightarrow (SSG_2) \rightarrow (SSG_2+SSG_3) \rightarrow (SSG_3) \rightarrow \ldots \rightarrow (SSG_{n-1}+SSG_n) \rightarrow (SSG_n)$, while the selected cell is synchronously supplied with a pulse (or a corresponding voltage) from the selected word line WL_s. In the case of the example of FIG. 21, since the matrix W is n rows by (2×n+1) columns, it is only required that a matrix of (2×n+1) rows by n columns be employed as the matrix T for correction. Moreover, more generally, the number of intermediate states of time series data may be 2 or more. Furthermore, in a portion corresponding to both ends of the word line comb WLC, it is also possible to omit a pulse for correction or add a pulse of additional correction, and there is a large degree of arbitrariness in the number of columns of the matrix W. In this connection, the number of rows of the matrix T for correction need only match the number of columns of the matrix W.

Next, a flow of the write operation will be described.

Figure 22:
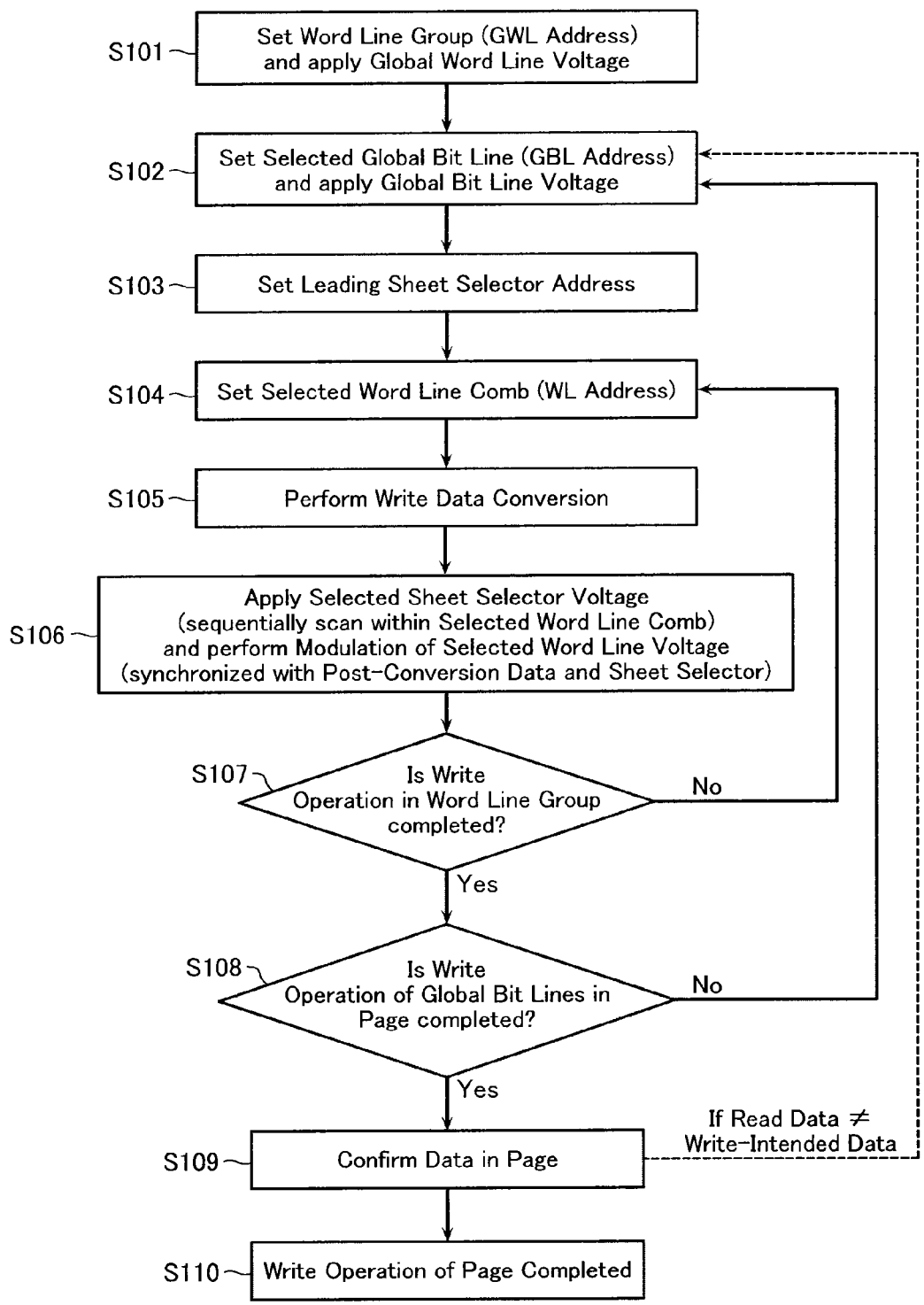
FIG. 22 is an example of a flowchart during the write operation in the memory device according to same embodiment.

FIG. 22 is an example of a flowchart during the write operation in the memory device according to the present embodiment.

First, in step S101, a global word line address that selects a word line group is set, and the selected global word line is applied with a selected global word line voltage.

Following this, in step S102, a global bit line address that selects a global bit line is set, and the selected global bit line is applied with a selected global bit line voltage.

Following this, in step S103, a sheet selector address that selects a bit line is set. The sheet selector address only sets a leading address of a series of sheet selectors and selected sheet selector voltage is not yet applied.

Following this, in step S104, a selected word line address that selects a word line comb is set. The selected word line address also only sets an address and selected word line voltage is not yet applied.

Following this, in step S105, a certain write data conversion is performed on a series of write data sequences.

Following this, in step S106, the selected sheet selector is sequentially applied with a voltage to cause transition of an address, and, synchronized with this transition of the address, a modulation corresponding to post-data-conversion data is added to a selected word line voltage.

The above steps S104 to S106 cause the write operation to be sequentially performed on the word line comb in the selected word line group. Moreover, steps S104 to S106 are repeated until the write operation on the word line combs in the selected word line group is completed (step S107).

Furthermore, the above steps S102 to S107 cause the write operation to be sequentially performed on the selected global bit line in a page. Moreover, steps S102 to S107 are repeated until the write operation on the global bit lines in the page is completed (step S108).

Finally, in step S109, confirmation of data in the page is performed, if read data and write-intended data are identical, processing is completed (step S110), and if different, step S102 is returned to, and a retry processing is performed.

Next, a flow of the read operation will be described.

Figure 23:
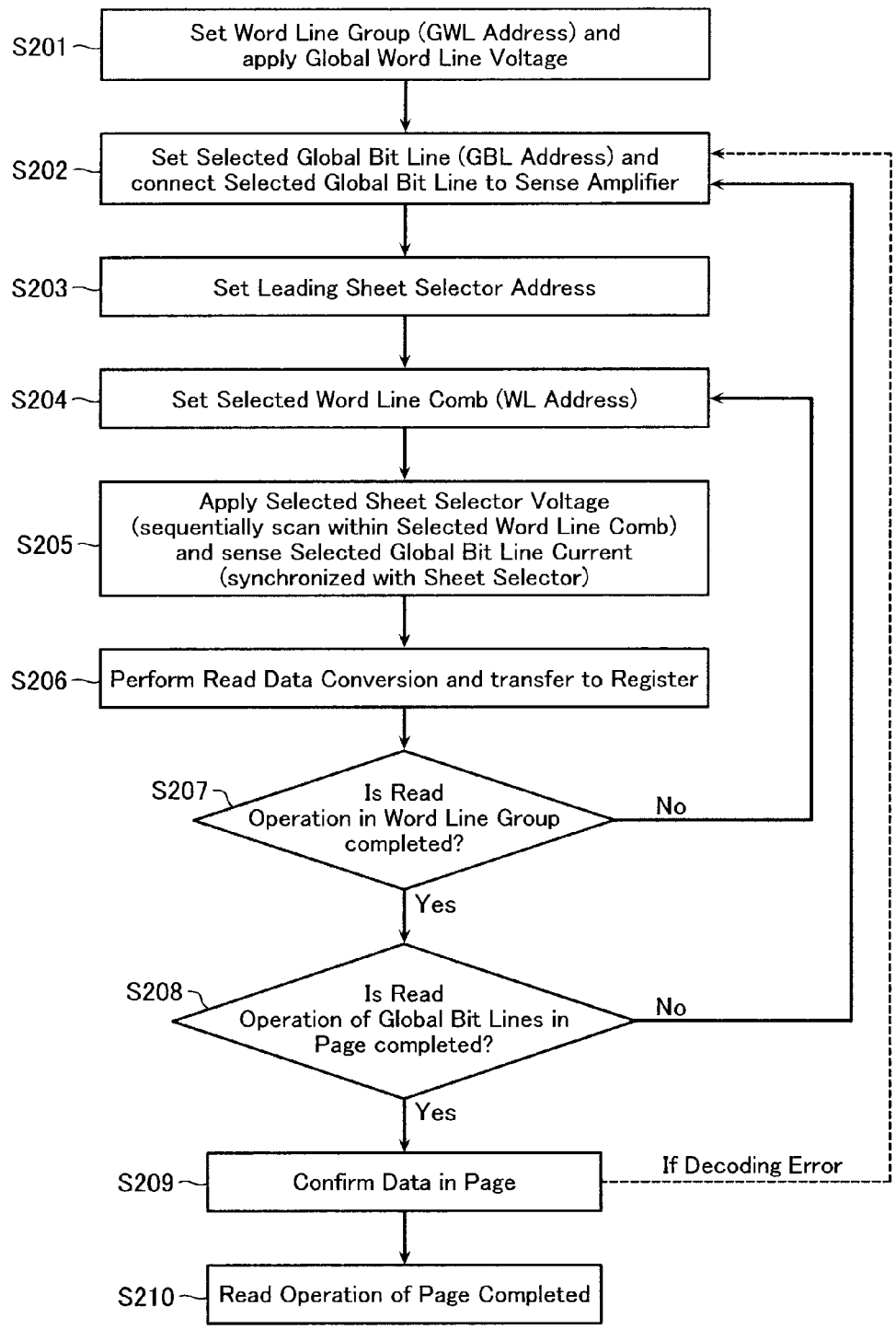
FIG. 23 is an example of a flowchart during the read operation in the memory device according to same embodiment.

FIG. 23 is an example of a flowchart during the read operation in the memory device according to the present embodiment.

First, in step S201, the global word line address that selects the word line group is set, and the selected global word line is applied with the selected global word line voltage. The selected global bit line and an unselected global bit line, being in a standby state, are already applied with a voltage.

Following this, in step S202, the global bit line address that selects the global bit line is set, and a sense amplifier is connected to the selected global bit line. Note that as previously mentioned, voltages of the selected global bit line and the unselected global bit line during the read operation are equal.

Following this, in step S203, the sheet selector address that selects the bit line is set. The sheet selector address only sets a leading address of a series of sheet selectors and selected sheet selector voltage is not yet applied.

Following this, in step S204, the selected word line address that selects the word line comb is set, and the selected word line voltage is applied.

Following this, in step S205, the selected sheet selector is sequentially applied with a voltage, an output of the sense amplifier connected to the selected global bit line is detected synchronized with the selected sheet selector address, and cell data is read as the output of the sense amplifier.

Following this, in step S206, read data undergoes data conversion and is sequentially transferred to a register.

The above steps S202 to S206 cause the read operation to be sequentially performed on the word line comb in the selected word line group. Moreover, steps S204 to S206 are repeated until the read operation on the word line combs in the word line group is completed (step S207).

Furthermore, the above steps S202 to S207 cause the read operation to be sequentially performed on the selected global bit line in a page. Moreover, steps S202 to S207 are repeated until the read operation on the selected global bit lines in the page is completed (step S208).

Finally, in step S209, confirmation of data in the page is performed, if a decoding error is not present, processing is completed (step S210), and if present, step S202 is returned to, and a retry processing is performed.

Next, a timing chart during the write operation and during the read operation will be simply described.

FIGS. 24 to 30 are examples of timing charts during the write operation and the read operation in the memory device according to the present embodiment. FIGS. 24 to 30 show voltage waveforms, with respect to time, of the selected global word line GWL_s, the unselected global word line GWL_u, the selected global bit line GBL_s, the unselected global bit line GBL_u, the selected word line WL_s, the unselected word line WL_u, and the gate lines $SSG_0$ to $SSG_{n-1}$.

Figure 24:
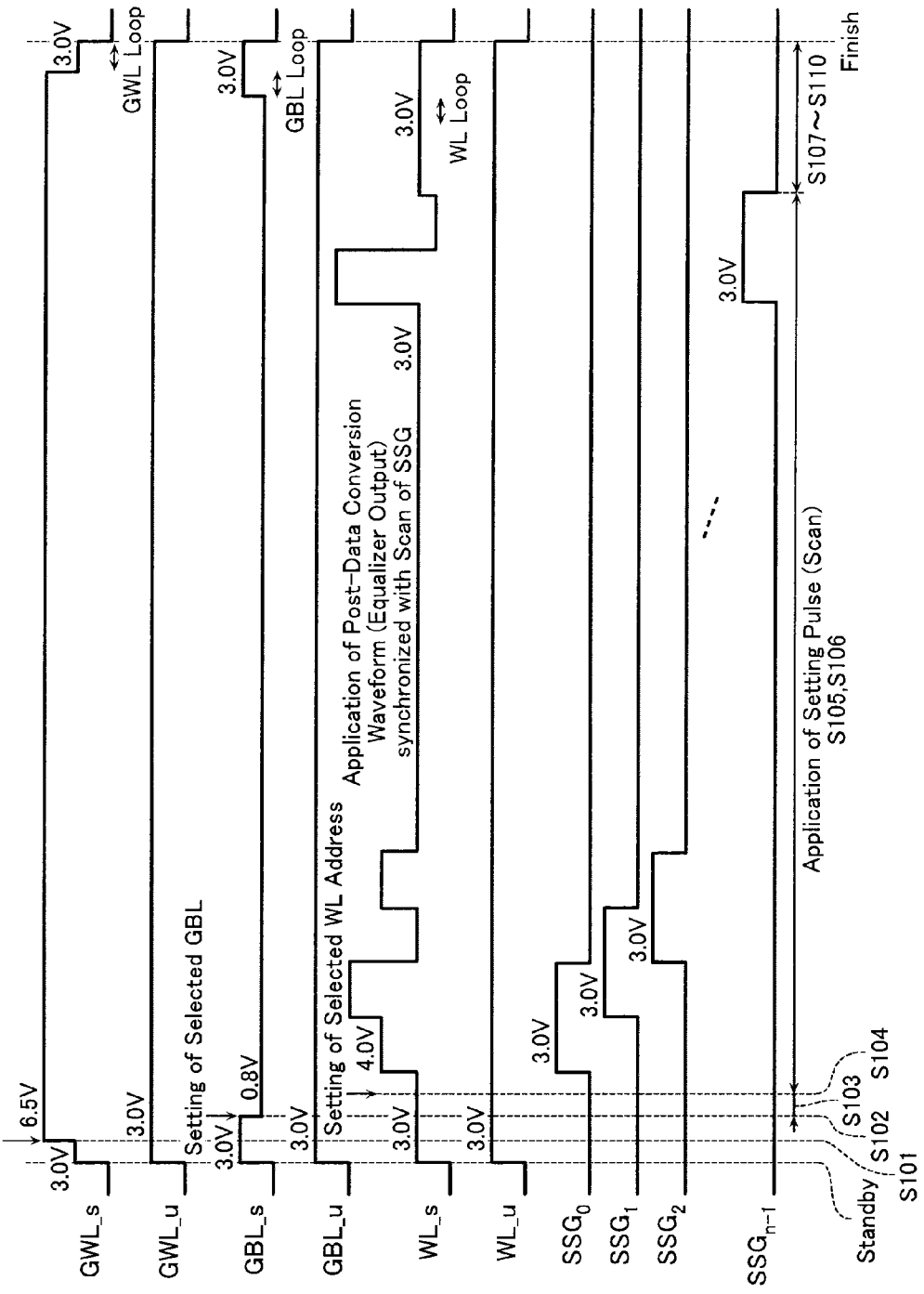
FIG. 24 is an example of a timing chart during the write operation (setting operation) in the memory device according to same embodiment.

FIG. 24 is an example of a timing chart during the write operation (setting operation) of the present embodiment. FIG. 24 is for the case of using the flowchart of FIG. 22, and is a voltage waveform corresponding to the case of the gate lines SSG scan shown in FIG. 15. Note that in the case of the setting operation, the sheet selector is also sometimes employed to perform current limiting. In this case, not only the selected word line voltage (voltage between the selected word line WL_s and the selected global bit line GBL_s), but also the voltage of the gate line SSG may be modulated corresponding to data.

Figure 25:
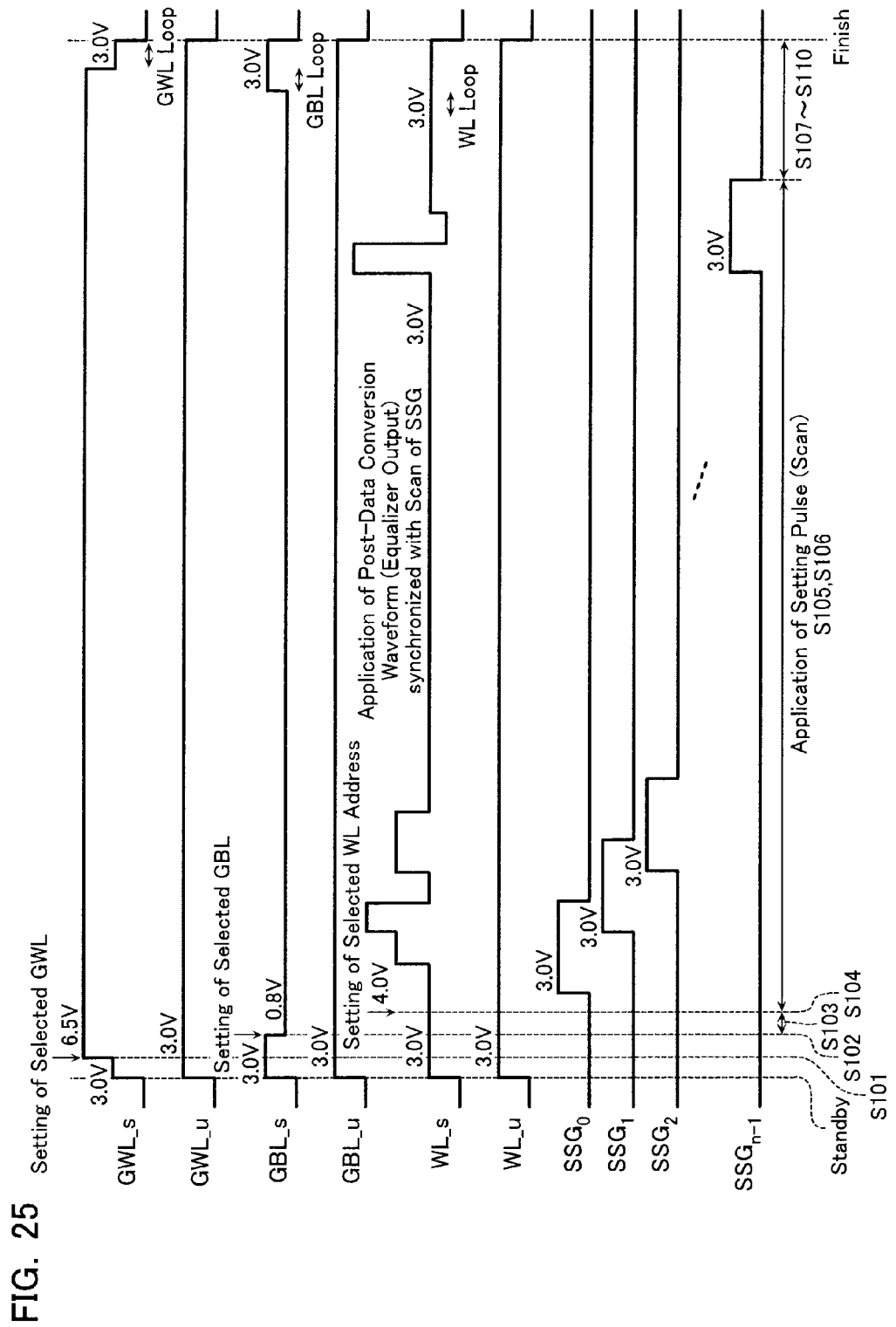
FIG. 25 is an example of a timing chart during the write operation (setting operation) in the memory device according to same embodiment.

FIG. 25 is an example of a timing chart during the write operation (setting operation) of the present embodiment. FIG. 25 is for the case of using the flowchart of FIG. 22, and is a voltage waveform corresponding to the case of the gate lines SSG scan shown in the lower view of FIG. 21. Note that in the case of the setting operation, the sheet selector is also sometimes employed to perform current limiting. In this case, not only the selected word line voltage (voltage between the selected word line WL_s and the selected global bit line GBL_s), but also the voltage of the gate line SSG may be modulated corresponding to data.

Figure 26:
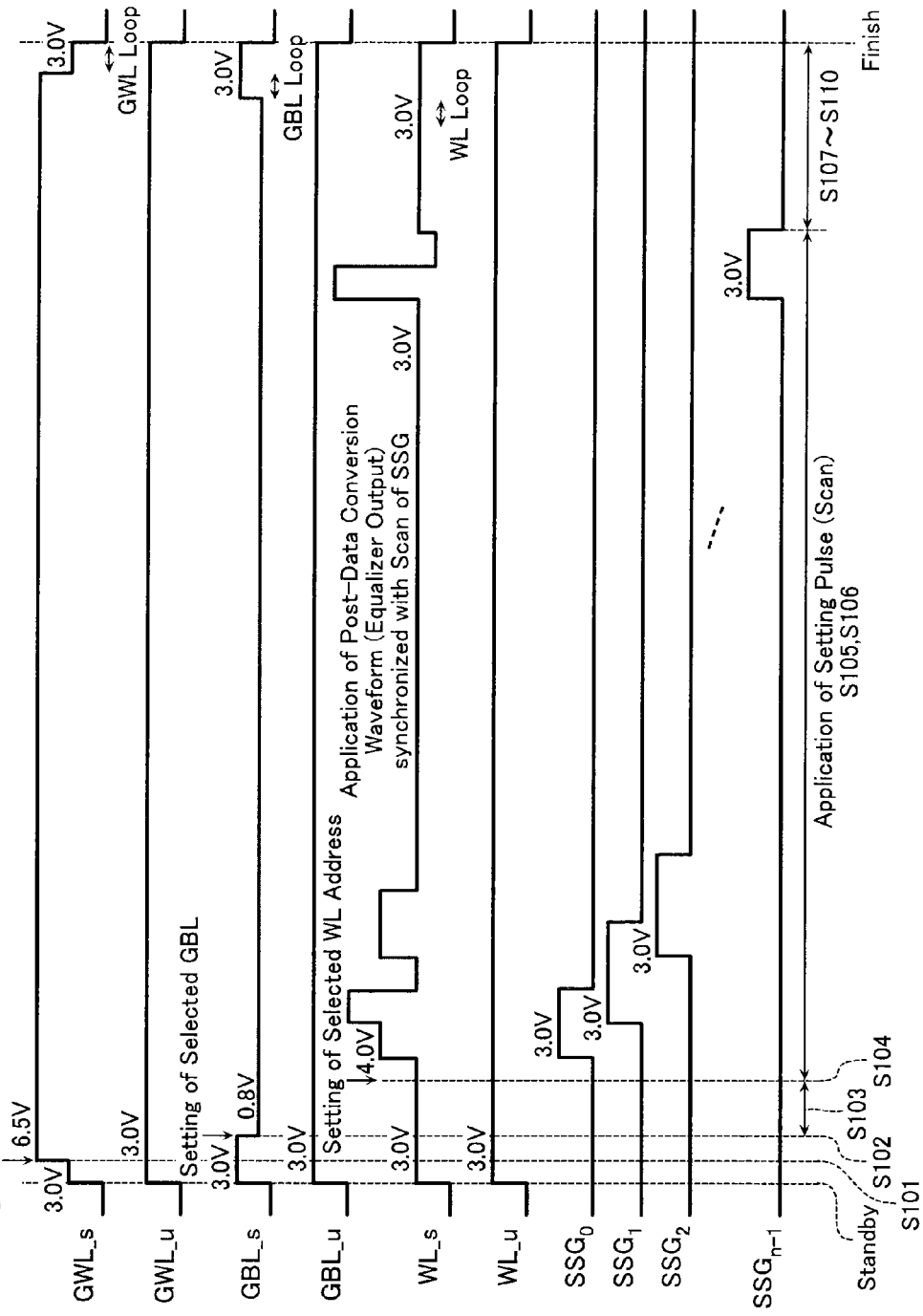
FIG. 26 is an example of a timing chart during the write operation (setting operation) in the memory device according to same embodiment.

FIG. 26 is an example of a timing chart during the write operation (setting operation) of the present embodiment. FIG. 26 is for the case of using the flowchart of FIG. 22, and is a voltage waveform corresponding to the case of the gate lines SSG scan shown in the lower view of FIG. 21 and, furthermore, for the case where the portion corresponding to both ends of the word line comb has the pulse for correction omitted. Therefore, a width of the pulse applied to the gate lines $SSG_0$ and $SSG_{n-1}$ is configured shorter than that of the other gate lines (for example, $SSG_1$). Note that in the case of the setting operation, the sheet selector is also sometimes employed to perform current limiting. In this case, not only the selected word line voltage (voltage between the selected word line WL_s and the selected global bit line GBL_s), but also the voltage of the gate line SSG may be modulated corresponding to data.

Figure 27:
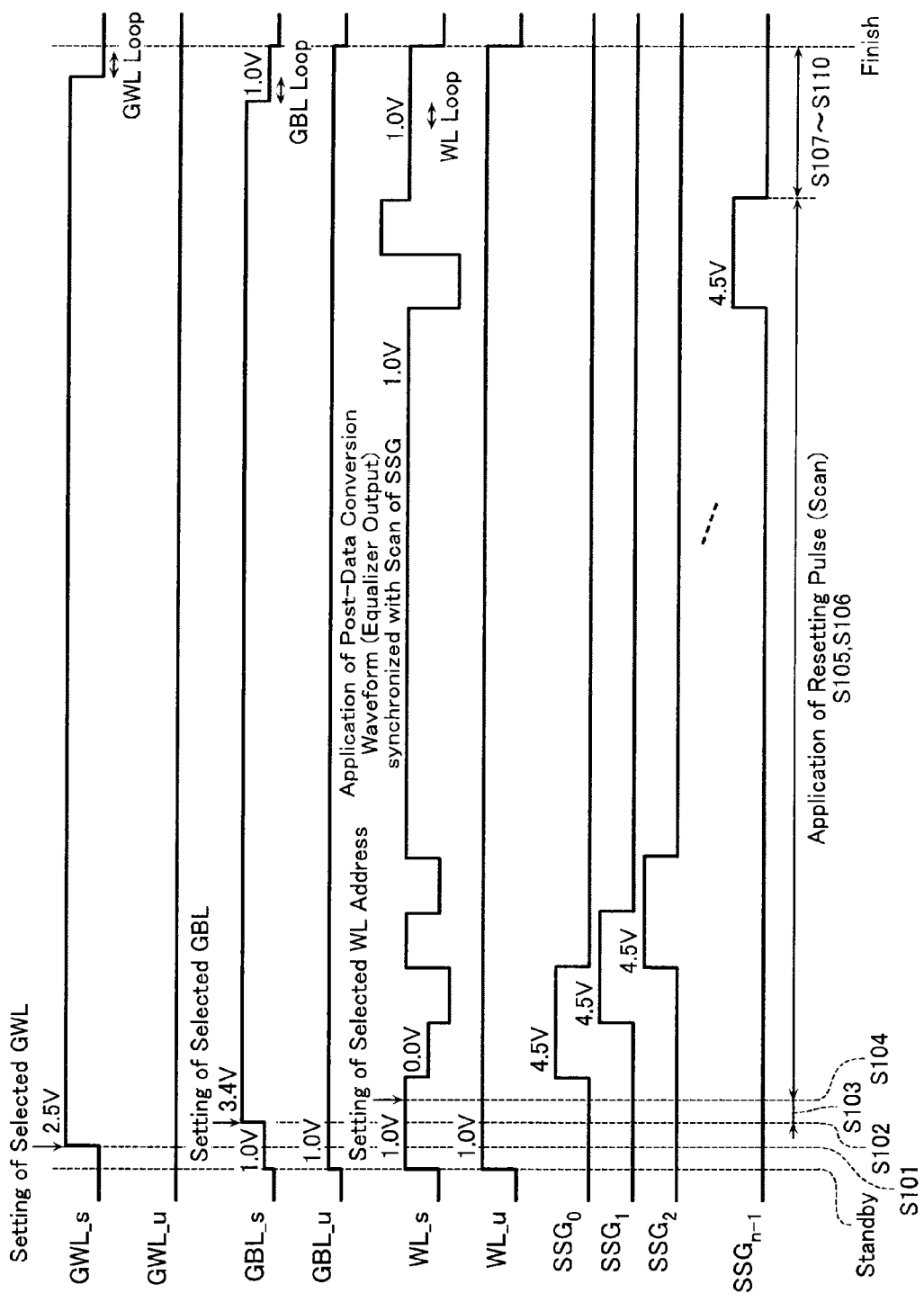
FIG. 27 is an example of a timing chart during the write operation (resetting operation) in the memory device according to same embodiment.

FIG. 27 is an example of a timing chart during the write operation (resetting operation) of the present embodiment. FIG. 27 is for the case of using the flowchart of FIG. 22, and is a voltage waveform corresponding to the case of the gate lines SSG scan shown in FIG. 15.

Figure 28:
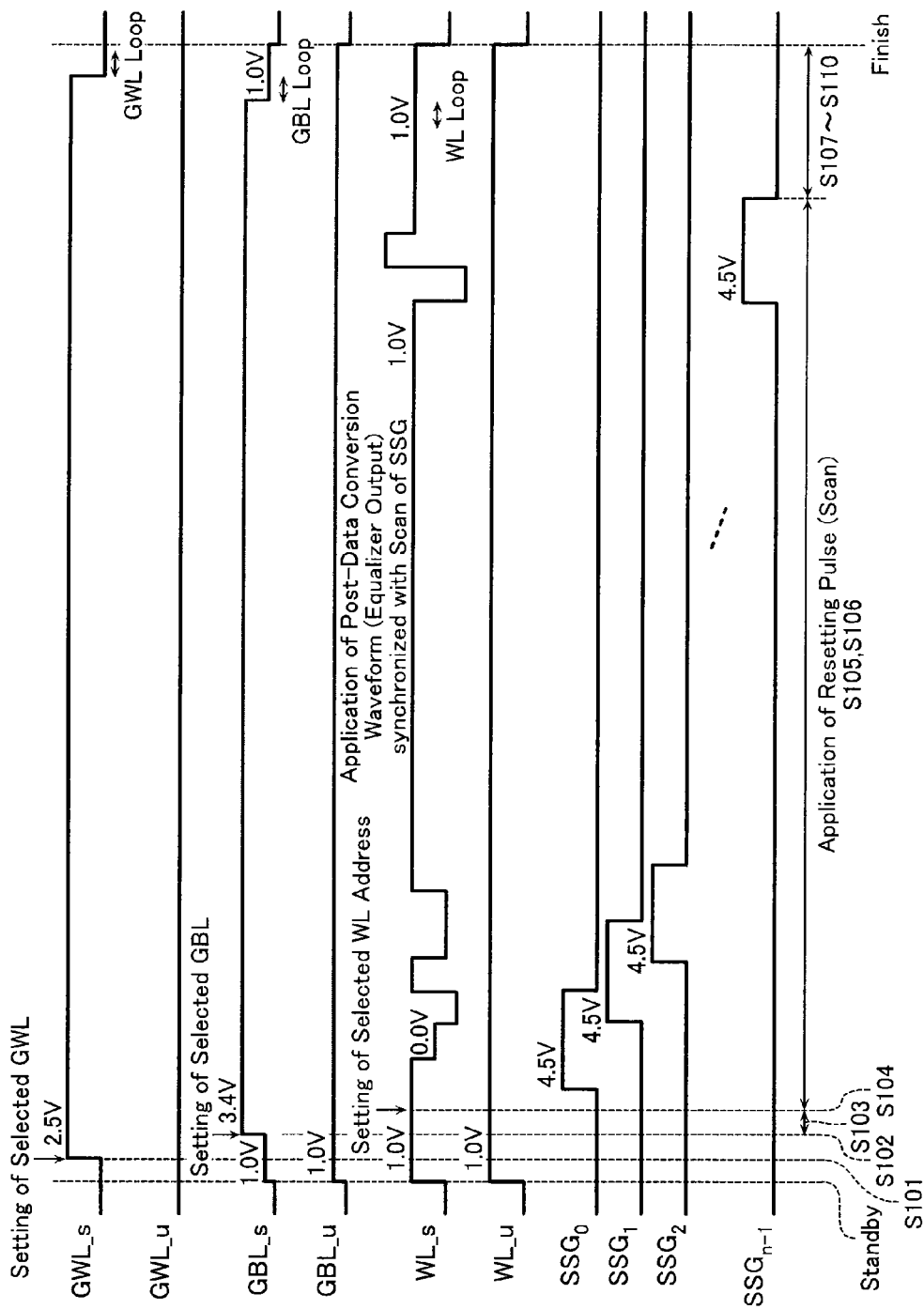
FIG. 28 is an example of a timing chart during the write operation (resetting operation) in the memory device according to same embodiment.

FIG. 28 is an example of a timing chart during the write operation (resetting operation) of the present embodiment. FIG. 28 is for the case of using the flowchart of FIG. 22, and is a voltage waveform corresponding to the case of the gate lines SSG scan shown in the lower view of FIG. 21.

Figure 29:
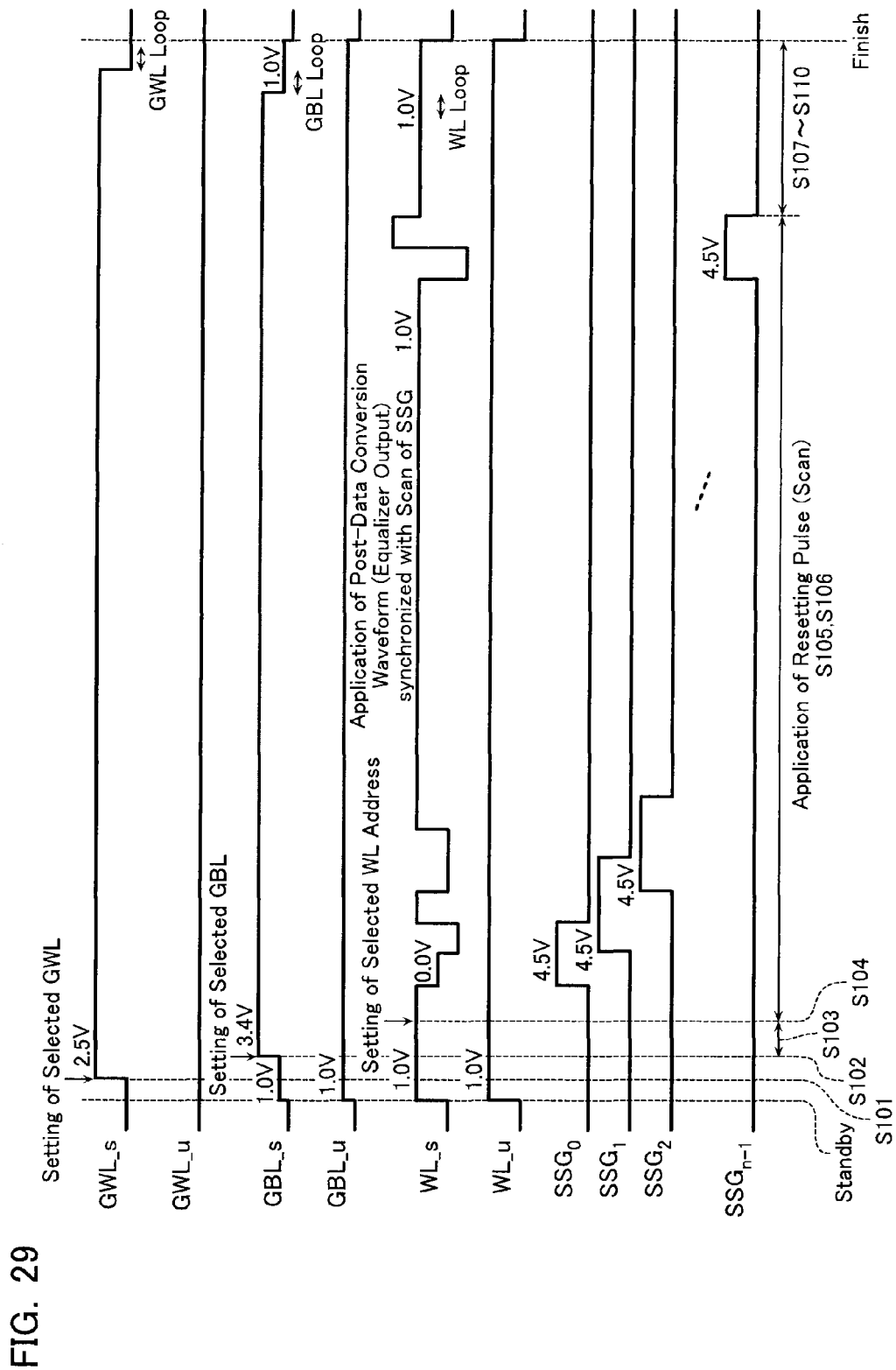
FIG. 29 is an example of a timing chart during the write operation (resetting operation) in the memory device according to same embodiment.

FIG. 29 is an example of a timing chart during the write operation (resetting operation) of the present embodiment. FIG. 29 is for the case of using the flowchart of FIG. 22, and is a voltage waveform corresponding to the case of the gate lines SSG scan shown in the lower view of FIG. 21 and, furthermore, for the case where the portion corresponding to both ends of the word line comb has the pulse for correction omitted. Therefore, a width of the pulse applied to the gate lines $SSG_0$ and $SSG_{n-1}$ is configured shorter than that of the other gate lines (for example, $SSG_1$).

Figure 30:
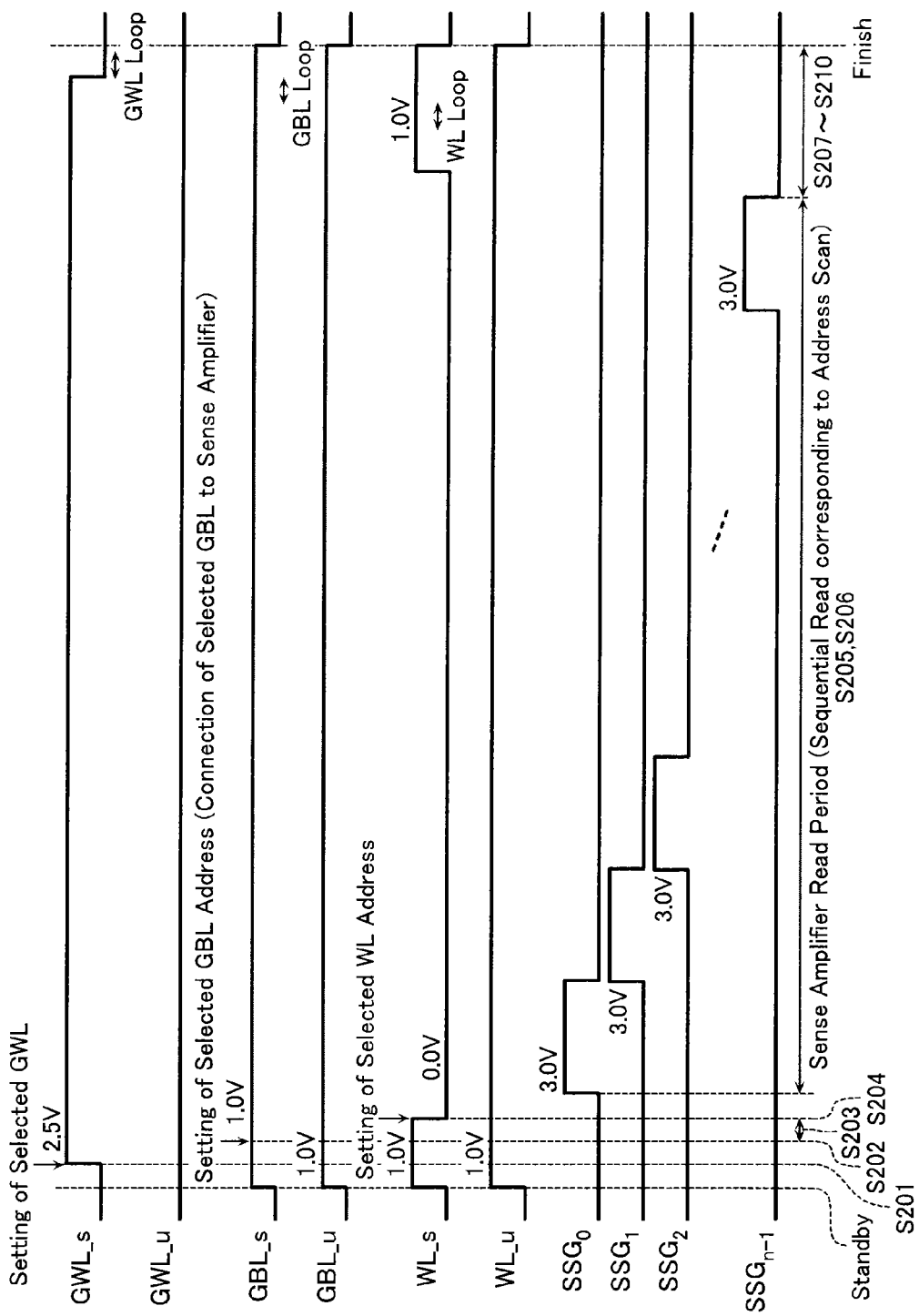
FIG. 30 is an example of a timing chart during the read operation in the memory device according to same embodiment.

FIG. 30 is an example of a timing chart during the read operation of the present embodiment. FIG. 30 is for the case of using the flowchart of FIG. 23, and is a voltage waveform corresponding to the case of the gate lines SSG scan shown in FIG. 16.

Next, higher order correction of data during the write operation and the read operation will be described.

Displaying data processing in matrix form also enables a higher order of correction of data to be easily achieved. Now, higher order correction refers to correction of a write level or a read level resulting from a cell current flowing in, for example, a half-selected cell connected to an unselected word line but sharing a selected bit line, or a half-selected cell connected to an unselected bit line but sharing a selected word line. This is effective in the case where a data unit of the write operation and the read operation is a large unit of about several kilobytes referred to, for example, as a page, whose unit is larger than a data size of the word line comb loop.

For example, the presence of the cell current of the half-selected cell causes IR drop, and so on, of lines to differ. As a result, even if a magnitude of the pulse applied between the selected global bit line and the selected word line is identical, the voltage actually applied to the selected cell sometimes may differ, although only slightly. In the case of the write operation, this voltage difference is sometimes directly reflected in a state of the cell, and in the case of the read operation, this voltage difference is sometimes converted to a difference in cell current to be reflected in a read data value. These effects sometimes appear as interference between cells of a wide range sharing bit lines or word lines.

Figure 31:
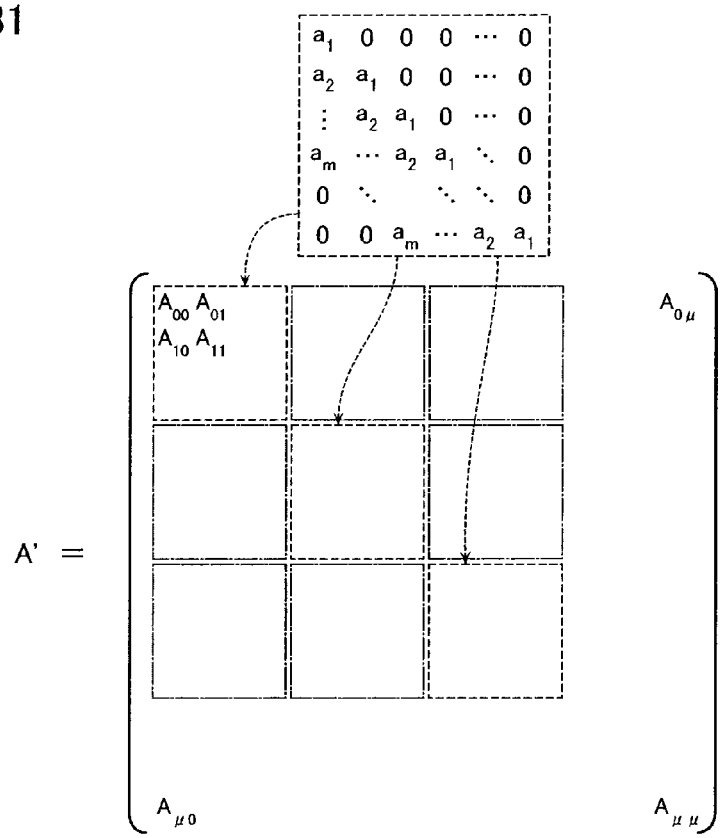
FIG. 31 is an example of a view explaining a relationship between a matrix employed in arithmetic processing and a data unit during the write operation and the read operation in the memory device according to same embodiment.

As shown in, for example, FIG. 31, even in such a case, by employing a large matrix matched to the data unit (for example, a page unit) of the write operation and the read operation, it is possible to perform correction including interference between cells of a wide range.

FIG. 31 is an example of a view explaining a relationship between a matrix employed in arithmetic processing and a data unit during the write operation and the read operation in the memory device according to the present embodiment.

In line with the previously described examples, a situation where data has been converted by interference between data cells during the write operation and the read operation is expressed using a matrix A'. In this case, as shown in FIG. 31, the n×n sub matrices (portions shown by broken lines of FIG. 31) aligned in a diagonal portion of the matrix A' need only be set to matrix elements corresponding to data conversion in the loop of the word line combs exemplified by mathematical expression (4). The other non-diagonal sub matrix portions (portions shown by dashed-dotted lines of FIG. 31) correspond to data conversion expressing interference between cells sharing bit lines or word lines. For example, all that is required is to set the k-th row and j-th column of matrix elements to a constant value of "$a_{b1}$" in the case where the k-th cell and the j-th cell share the bit line, to a constant value of "$a_{w1}$" in the case where the k-th cell and the j-th cell do not share the global bit line but do share the word line, and to a constant value of "0" in other cases excluding the case where the k-th cell and the j-th cell share the global bit line and share the word line. Note that the case where the k-th cell and the j-th cell share the global bit line and share the word line is included in the matrix of mathematical expression (4), hence is not included in this non-diagonal component. That is, it may be approximated that a contribution of the non-diagonal sub matrix corresponding to the k-th cell is proportional to the number of half-selected cells sharing the bit line or the word line that are on-cells (cells storing a data value "1").

Furthermore, generally, "$a_{b1}$" and "$a_{w1}$" which are correction values of this non-diagonal sub matrix portion are smaller than correction values of the diagonal sub matrix portion, hence first-order perturbation approximation is possible. That is, the matrix A' can be expressed by the sum of the sub matrix portion A aligned in a diagonal portion (for example, mathematical expression (4)) and the remaining non-diagonal sub matrix portion P (A'=A+P), and elements of the small matrix portion P may be regarded as being sufficiently smaller than elements of the matrix A. At this time, if a matrix B' is assumed to be an inverse matrix of the matrix A', then the matrix B' can also be expressed by the sum of a sub matrix portion B aligned in a diagonal portion and a remaining non-diagonal sub matrix portion Q (B'=B+Q), the matrix B is an inverse matrix of the matrix A, and elements of the non-diagonal sub matrix portion Q may be regarded as being sufficiently smaller than elements of the matrix B. As a result, from definition of an inverse matrix, a matrix product A'B' and a matrix product AB both become unit matrices, and a matrix product PQ becomes a minute item of second order or more. Therefore, from the fact that A'B'=(A+P) (B+Q)≈AB+PB+AQ, it may be approximated that AQ=−PB.

Now, the gist of the present embodiment is making the input data x and data after the write operation and the read operation (=A'y=A'B'x=x) identical by performing a conversion by the matrix B', which is the inverse matrix of the matrix A', in advance on input data x, and employing post-conversion data y (y=B'x) to perform the write operation and the read operation to/from memory. Therefore, it is only required to obtain the post-conversion data y, without the need to obtain the matrix B'=B+Q. Accordingly, first, $y_0$ is assumed as the post-conversion data in the case where the non-diagonal sub matrix portion P is not present. Then, using the matrix A, $y_0$ can be obtained from the expression $Ay_0$=x, similarly to in mathematical expression (6). At this time, from definition, it is also possible to notate as $y_0$=Bx. In addition, multiplying the matrix A from the left to post-conversion data y=B'x=(B+Q)x=Bx+Qx gives Ay=x+AQx=x−PBx=x−$Py_0$. As a result, by once again employing a sequence similar to when obtaining mathematical expression (6), the post-conversion data y can be obtained from the input data x and elements of conversion matrix A'=A+P.

In this way, the matrix product A'B' can be configured to be a unit matrix and interference between cell data during the write operation and the read operation can be negated, even when data dependency of current of the half-selected cells, which share the bit line or the word line, cannot be ignored.

Next, raising of functionality of the above-described data processing will be described.

Figure 32:
FIG. 32 is one extended example of a circuit block diagram of the data read post-processing circuit of the memory device according to same embodiment.

Content of the data write pre-processing circuit and the data read post-processing circuit of FIG. 3 is not limited to the examples of FIGS. 4 and 5, and it is also possible to combine, for example, a function of a data error correction circuit (ECC). In this case, the maximum likelihood decoder of FIG. 5 is substituted by a more general decoder called Maximum a posteriori decoding (MAP decoding), which covers a maximum likelihood decoding. As shown in FIG. 32, a module of MAP decoding can be modeled by, for example, a Soft-in Soft-out (SISO) module. The SISO module has as its inputs an input data value $u_k$ and an output data value $x_k$, and a priori probabilities information $L_a$ ($u_k$) and $L_a$ ($x_k$) of these data values, and outputs extrinsic information $L_e$ ($u_k$) and $L_e$ ($x_k$) with respect to $u_k$ and $x_k$. Inside of SISO module, a posteriori probabilities information are calculated from inputs and used to output the results. Note that in many cases, probability is expressed by a logarithmic ratio.

Figure 33:
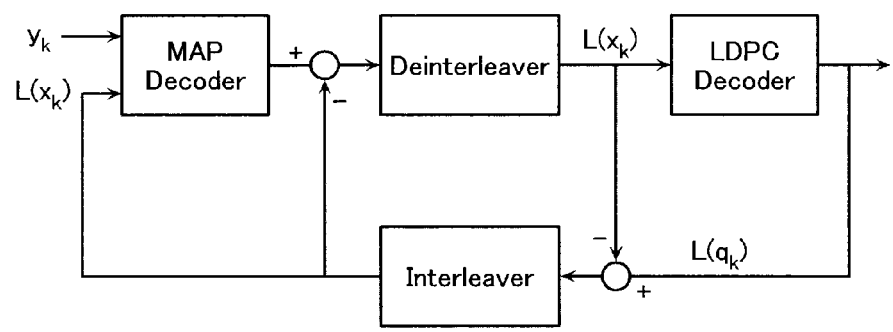
FIG. 33 is one extended example of a circuit block diagram of the data read post-processing circuit of the memory device according to same embodiment.

Moreover, more generally, in the case of making combined use of a block called an interleaver (deinterleaver) that performs processing to rearrange an arrangement of data by a fixed rule (processing to return to the original arrangement) and performing ECC using, for example, LDPC decoding, part of the data read post-processing circuit can be configured using the example shown in FIG. 33. In FIG. 33, $y_k$ is an output from the data read processing circuit, and L ($x_k$) is a logarithmic likelihood ratio with respect to the data $x_k$. First, a MAP decoder calculates L ($x_k$) from $y_k$. Then, an LDPC decoder receives the L ($x_k$) as a priori information of the data $x_k$, via the deinterleaver; performs iterative decoding by a Belief Propagation (BP) algorithm, adopting this L ($x_k$) as an initial value; and outputs an updated result L ($q_k$) as a posteriori probability information. Furthermore, by having a difference of pre-post LDPC decoding (L($q_x$)−L ($x_k$)) fed back to the MAP decoder as updated a priori information of the data $x_k$, via the interleaver, decoding is repeated iteratively. Moreover, at a stage when L($q_k$) in the LDPC decoder has attained a fixed threshold or more, an iterative loop is finished and a decoding result is outputted to external.

Figure 34:
FIG. 34 is an example of a general circuit block diagram of the data write pre-processing circuit of the memory device according to same embodiment.

Note that ECC, the interleaver, and so on, require to be employed as a pair in both an encoder and a decoder, hence in the case where ECC, the interleaver, and so on, are employed in a decoder, that is, the data read post-processing circuit, they must be included also in the data write pre-processing circuit which is an encoder. This situation is illustrated in FIG. 34. FIG. 34 is a general example of a block diagram showing part of the data write pre-processing circuit of FIG. 3, and has, positioned between two encoders, a block called an interleaver that performs processing to rearrange an arrangement of data by a fixed rule. Moreover, the encoder includes a function to perform encoding of ECC.

Figure 35:
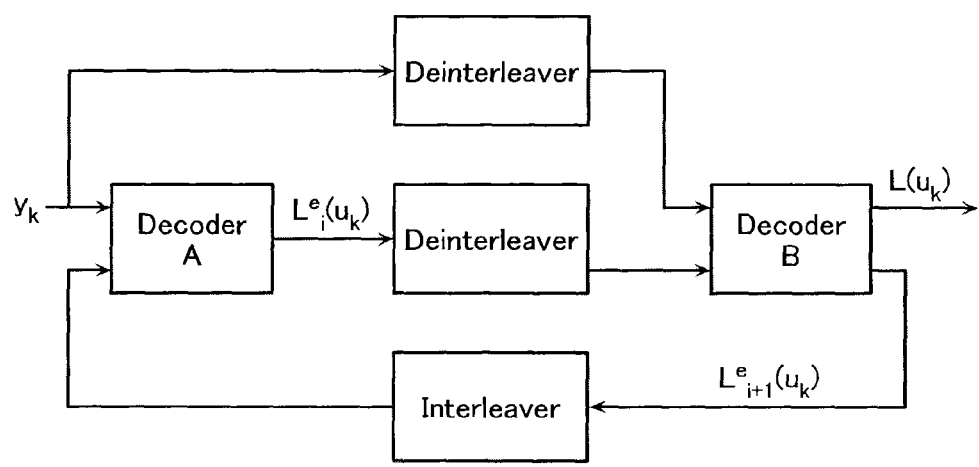
FIG. 35 is an example of a general circuit block diagram of the data read post-processing circuit of the memory device according to same embodiment.

Even more generally, as an example, in the case of employing the data write pre-processing circuit including the encoder of the configuration of FIG. 34, it is possible to employ the data read post-processing circuit including the configuration of FIG. 35. In FIG. 35, $y_k$ is an output from the data read processing circuit, and $L^e_i$ ($u_k$) is an extrinsic information, which relates to the reliabilities of bit information, in an i-th iteration on data $u_k$. First, a decoder A calculates $L^e_i(u_k)$ from $y_k$. Then, a decoder B receives the $L^e_i(u_k)$ as a priori information of the data $u_k$ via a deinterleaver, and receives the data $u_k$ via a different deinterleaver. Then, the decoder B, after decoding the input data value $u_k$, feeds back an updated result $L^e_{i+1}(u_k)$ to the decoder A via an interleaver, whereby decoding is repeated iteratively. Then, at a stage when L ($u_k$), which is a logarithmic likelihood ratio on data $u_k$, of the decoder B has attained a fixed threshold or more, an iterative loop is finished and a decoding result is outputted to external.

Next, a memory system applying the data processing system of the memory device described thus far will be described.

Figure 36:
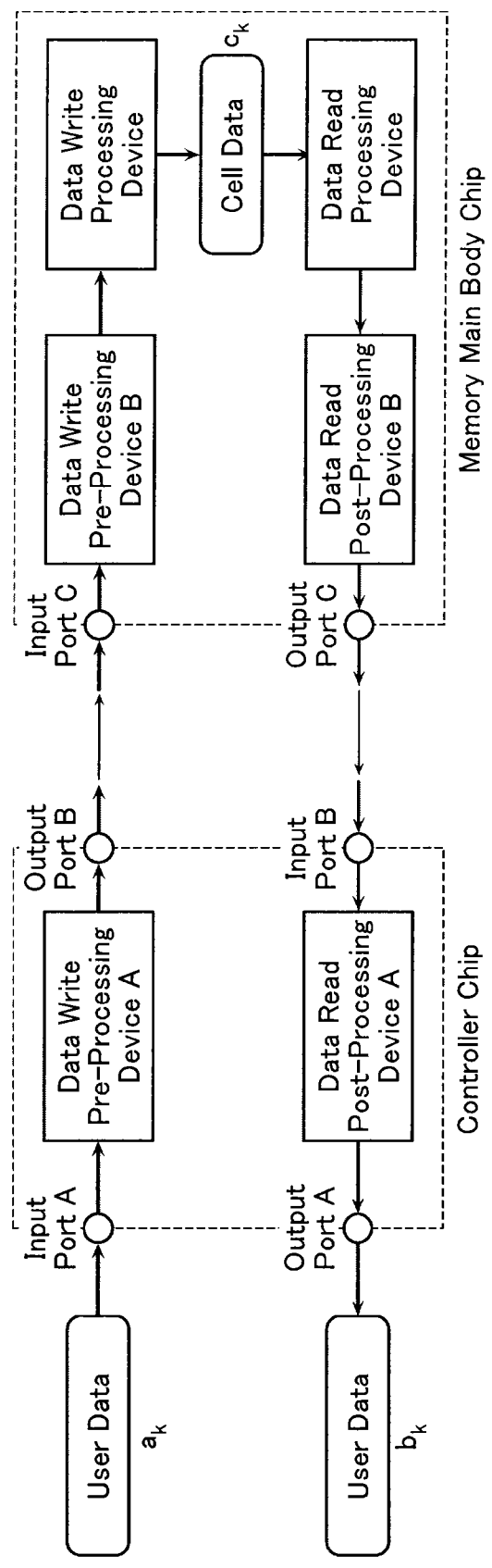
FIG. 36 is an example of a circuit block diagram of a data processing system in a memory system according to same embodiment.
Figure 37:
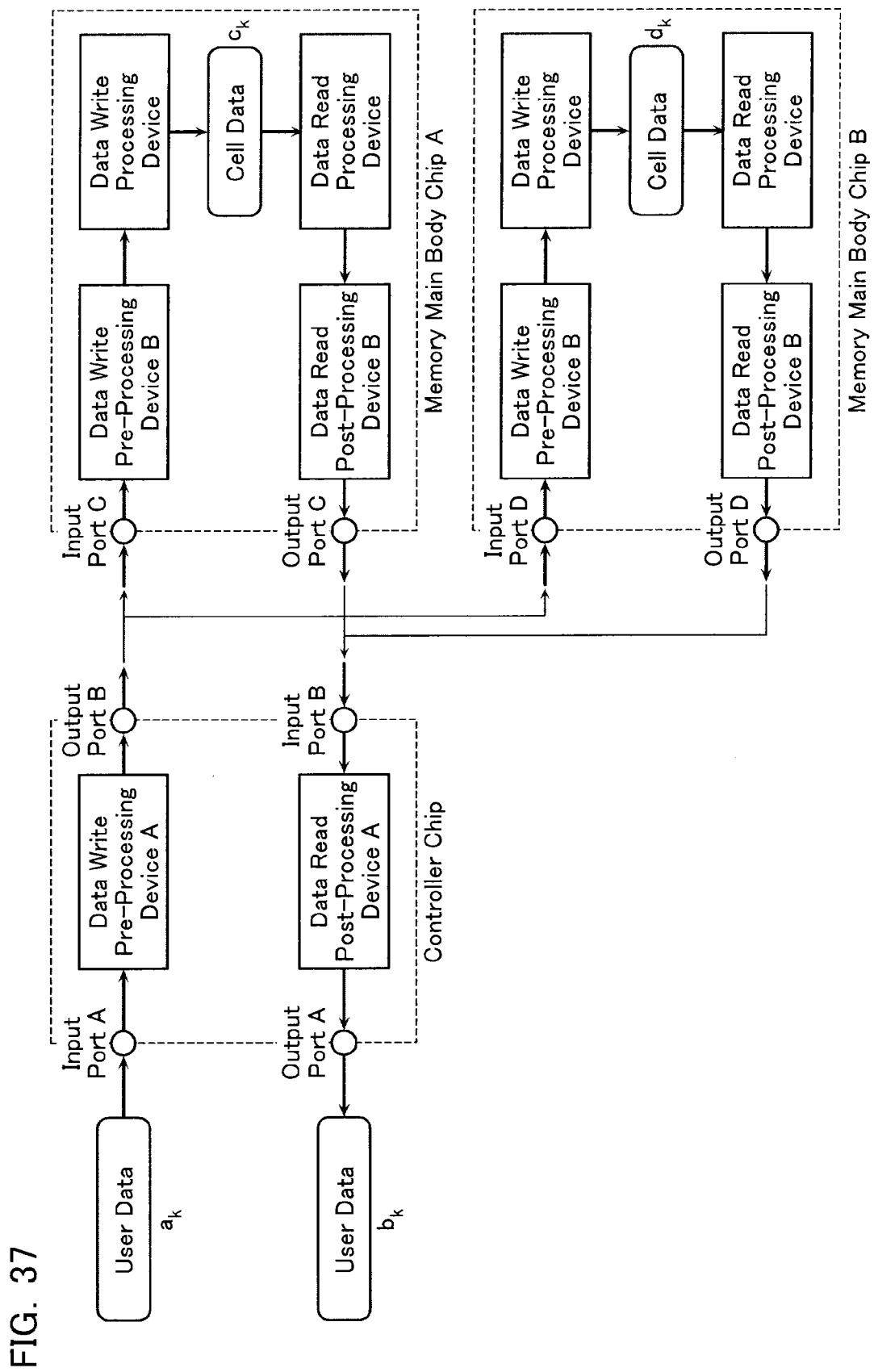
FIG. 37 is an example of a circuit block diagram of the data processing system in the memory system according to same embodiment.

FIGS. 36 and 37 are each an example of a circuit block diagram of the data processing system in the memory system according to the present embodiment. The memory systems of FIGS. 36 and 37 each comprise a memory main body chip and a controller chip.

For example, in the case where the data write pre-processing circuit and the data read post-processing circuit of FIG. 3 are configured by a plurality of blocks as in FIGS. 4 and 5, it is also possible for these to be disposed on a different chip and connected in a package. This corresponds to disposing the data write pre-processing circuit and the data read post-processing circuit divided in the memory main body chip and the controller chip. Note that a method employing ordinary bonding wire or a method employing direct linking between chips using TSV can be utilized for connection between chips in the package.

For example, as shown in FIG. 36, the data write pre-processing circuit is divided into a data write pre-processing circuit A and a data write pre-processing circuit B, the former being disposed on the controller chip and the latter being disposed on the memory main body chip. Similarly, the data read post-processing circuit is divided into a data read post-processing circuit A and a data read post-processing circuit B, the former being disposed on the controller chip and the latter being disposed on the memory main body chip. In this case, in the controller chip, there is no need for a step for forming the cell, hence it becomes possible to employ a high-speed logic circuit, thereby enabling performance of the memory system overall to be improved.

Furthermore, in order to effectively utilize the high-speed logic of the controller chip, it is also possible to connect two or more memory main body chips to one controller chip, for example, as shown in FIG. 37. In the case of FIG. 37, the data write pre-processing circuit is divided into a data write pre-processing circuit A and two data write pre-processing circuits B, the former being disposed on the controller chip and the latter being disposed on two memory main body chips A and B. Similarly, the data read post-processing circuit is divided into a data read post-processing circuit A and two data read post-processing circuits B, the former being disposed on the controller chip and the latter being disposed on the two memory main body chips A and B. Usually, an amount of input/output data per unit time capable of being processed by a controller chip is several times larger than an amount of input/output data per unit time capable of being processed by a memory main body chip, hence connecting a plurality of memory main body chips to one controller chip makes it possible to significantly improve an amount of input/output data per unit time from the viewpoint of a user.

The concept of data processing of the present embodiment is as follows, namely, in a memory device that comprises a plurality of cells and in which interference between cell data (interference between bits) is present in those cells: (1) to perform data write pre-processing, data read post-processing, or both, for correcting interference between cell data occurring during a write operation and a read operation; (2) to perform data read post-processing based on a result of data processing in (1) and information related to a probability of state transition of data accompanying a cell data read signal; and (3) to include part or all of processing such as ECC in the data write pre-processing and the data read post-processing, as required. Moreover, the present embodiment not only makes it possible to eliminate interference between cell data from the viewpoint of the user, but also, as shown in FIG. 17, makes it possible to raise tolerance to noise compared to a comparative example that assumes interference between cell data is not present, even when ECC is not employed.

As is clear from the above, the concept of data processing of the present embodiment is not limited to the memory device of the configuration of FIG. 1, and allows similar advantages to those of the memory device of the configuration of FIG. 1 to be obtained, even when applied to another configuration of the memory device. For example, in the case of NAND flash memory configured from a two-dimensional lattice of bit lines and word lines, as miniaturization of the cell proceeds, for example, interference between cell data is becoming increasingly significant. Of course, these kinds of interference between cell data are sometimes present even in the case of a configuration where the NAND flash memory is made three-dimensional, that is, even in the case where the memory cell array is configured from a two-dimensionally disposed bit line array and a word line (or word surface). Therefore, making appropriate changes to apply the previously described data processing of the present embodiment to such a two-dimensional or three-dimensional NAND flash memory allows similar advantages to those of the memory device of the configuration of FIG. 1 to be obtained even by NAND flash memory.

The present embodiment makes it possible to provide a memory device that can suppress interference between cell data occurring due to three-dimensional rendering of the memory cell array and that has data input/output speeded up, a method of controlling the memory device, and a memory system.

Second Embodiment

A second embodiment describes a manufacturing method of the memory cell array 100 described in the first embodiment. It should be noted that specific names of materials, dimensions, and so on, indicated in the description of the present embodiment are exemplary, and the present embodiment is not limited to these names of materials, dimensions, and so on.

FIGS. 38 to 49 are each an example of a view showing a process sequence of a forming process of the memory cell array of the memory device according to the second embodiment.

Figure 38:
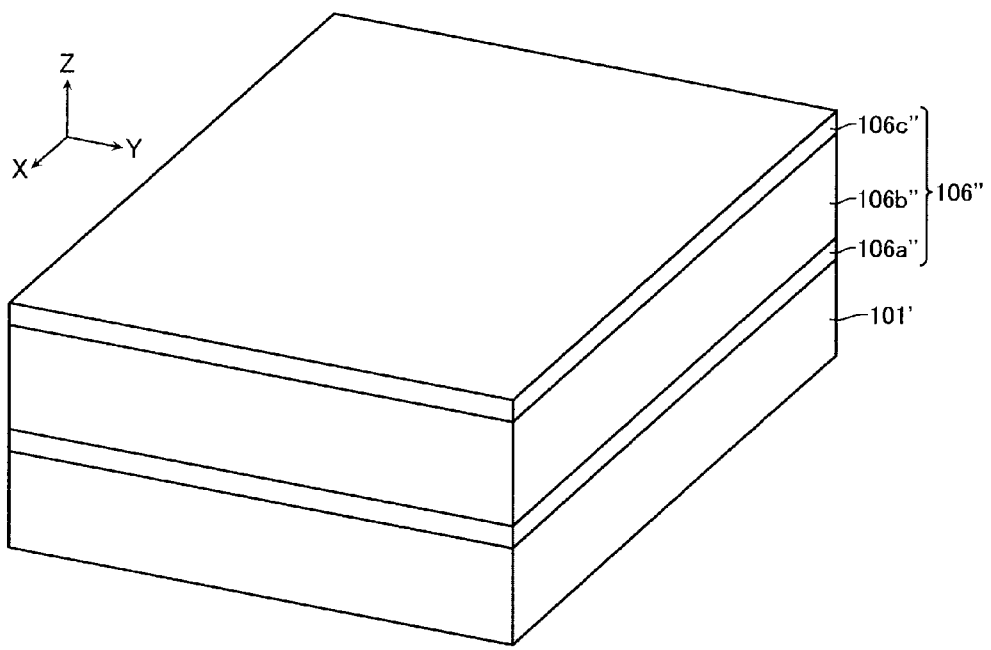
FIG. 38 is an example of a view showing a process sequence of a forming process of a memory cell array of a memory device according to a second embodiment.

First, as shown in FIG. 38, a layer 101' which is to become the global bit line and a layer 106" which is to become a silicon portion of the selection element are stacked sequentially on a semiconductor substrate not illustrated that has an X-Y plane as its principal plane. The layer 106" which is to become the silicon portion of the selection element has a structure in which there are stacked: an N+ Si layer 106a" having a thickness in a Z direction of 40 nm and an impurity concentration of $1 \times 10^{20}$ cm$^{-3}$ and which is to become a source electrode; a P– Si layer 106b" having a thickness in the Z direction of 120 nm and an impurity concentration of $1 \times 10^{18}$ cm$^{-3}$ and which is to become a channel; and an N+ Si layer 106c" having a thickness in the Z direction of 40 nm and an impurity concentration of $1 \times 10^{20}$ cm$^{-3}$ and which is to become a drain electrode.

Figure 39:
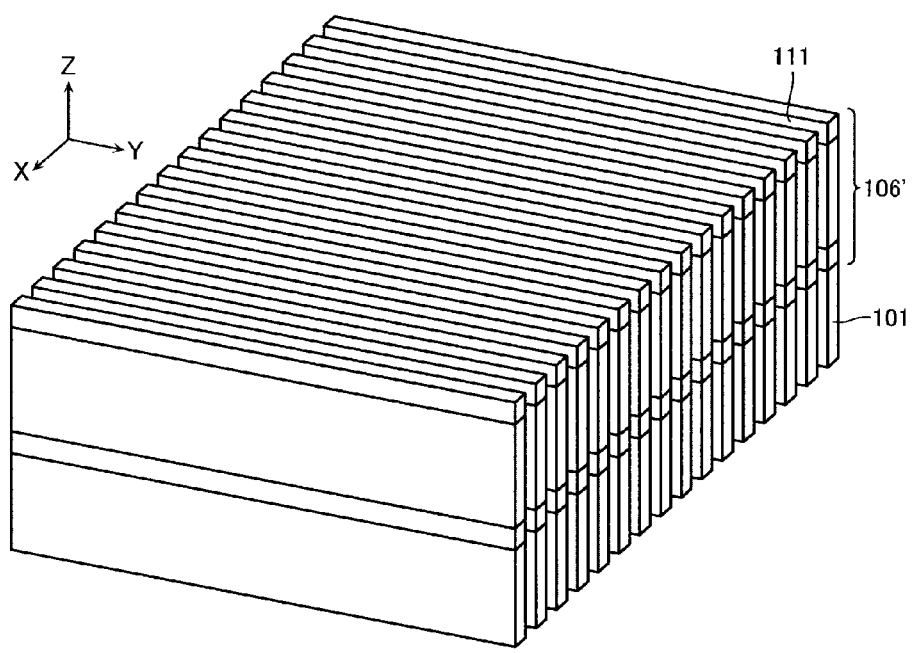
FIG. 39 is an example of a view showing the process sequence of the forming process of the memory cell array of the memory device according to same embodiment.

Following this, as shown in FIG. 39, RIE or the like is employed to form a plurality of trenches 111 in the layer 106" which is to become the silicon portion of the selection element and the layer 101' which is to become the global bit line, the plurality of trenches 111 extending in a Y direction and having the Z direction as a depth direction. This process results in the layer 101' which is to become the global bit line becoming the global bit line 101. In addition, the layer 106" which is to become the silicon portion of the selection element becomes a layer 106' which is to become the silicon portion of the selection element divided by the plurality of trenches 111. The global bit lines 101 and the layers 106' which are to become the silicon portion of the selection element are formed in a line-and-space pattern of line width 20 nm and line spacing 20 nm. Then, the plurality of trenches 111 are filled with an interlayer insulating film 112 not illustrated.

Figure 40:
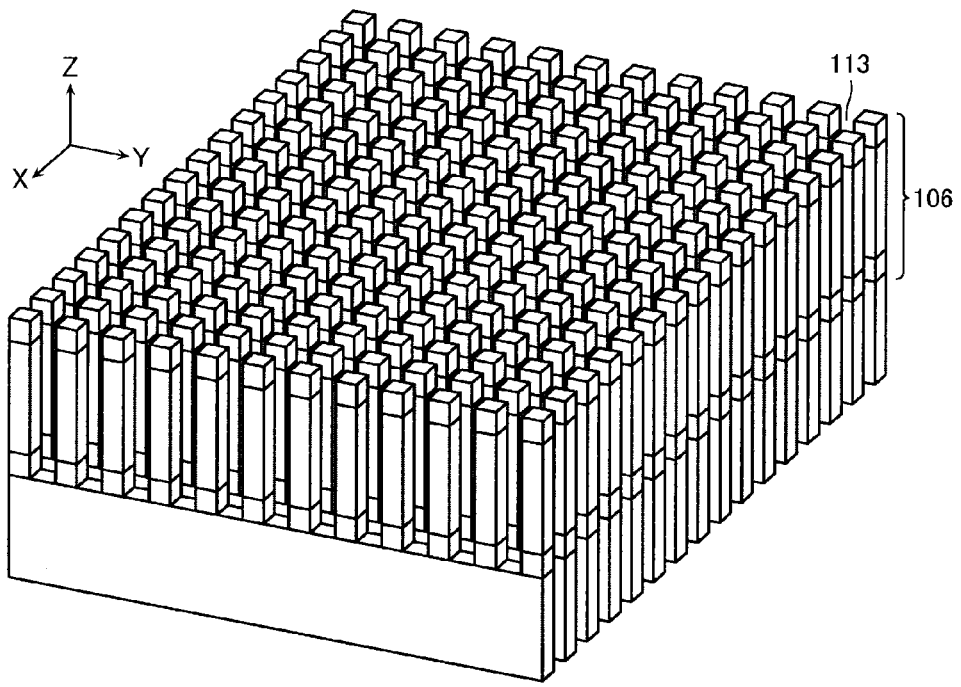
FIG. 40 is an example of a view showing the process sequence of the forming process of the memory cell array of the memory device according to same embodiment.

Following this, as shown in FIG. 40, RIE or the like is employed to form a plurality of trenches 113 in the layers 106' which are to become the silicon portion of the selection element and the interlayer insulating films 112, the plurality of trenches 113 extending in the X direction and having the Z direction as a depth direction. This process results in the layers 106' which are to become the silicon portion of the selection element becoming the silicon portion 106 of the selection element. The silicon portions 106 of the selection elements are formed in a line-and-space pattern of line width 15 nm, line spacing 25 nm, and half pitch 20 nm.

Figure 41:
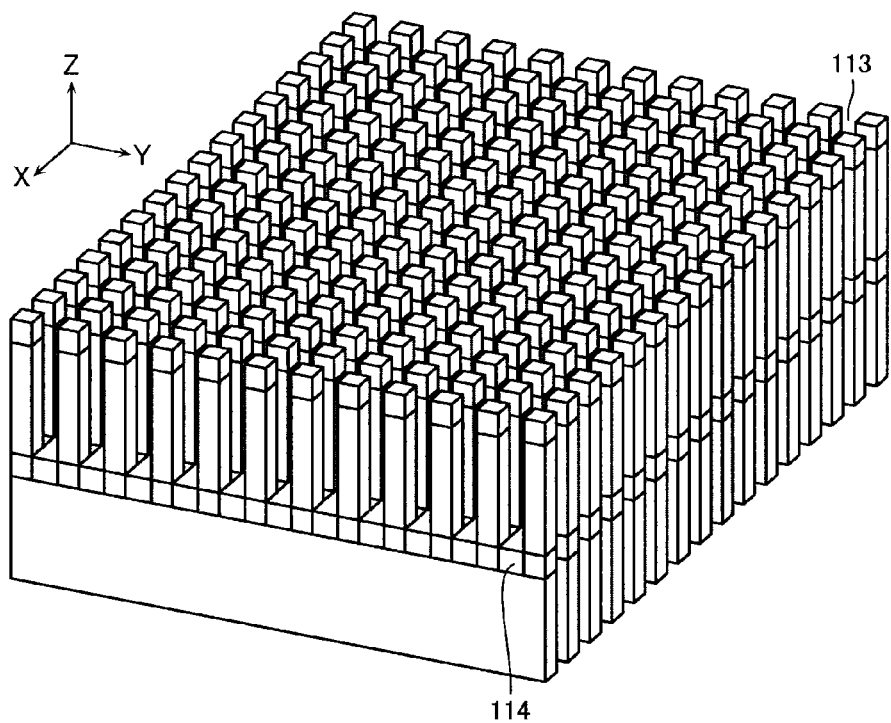
FIG. 41 is an example of a view showing the process sequence of the forming process of the memory cell array of the memory device according to same embodiment.

Following this, as shown in FIG. 41, the plurality of trenches 113 are filled with an interlayer insulating film 114. Then, the interlayer insulating film 114 is etched back until its thickness in the Z direction becomes 30 nm.

Figure 42:
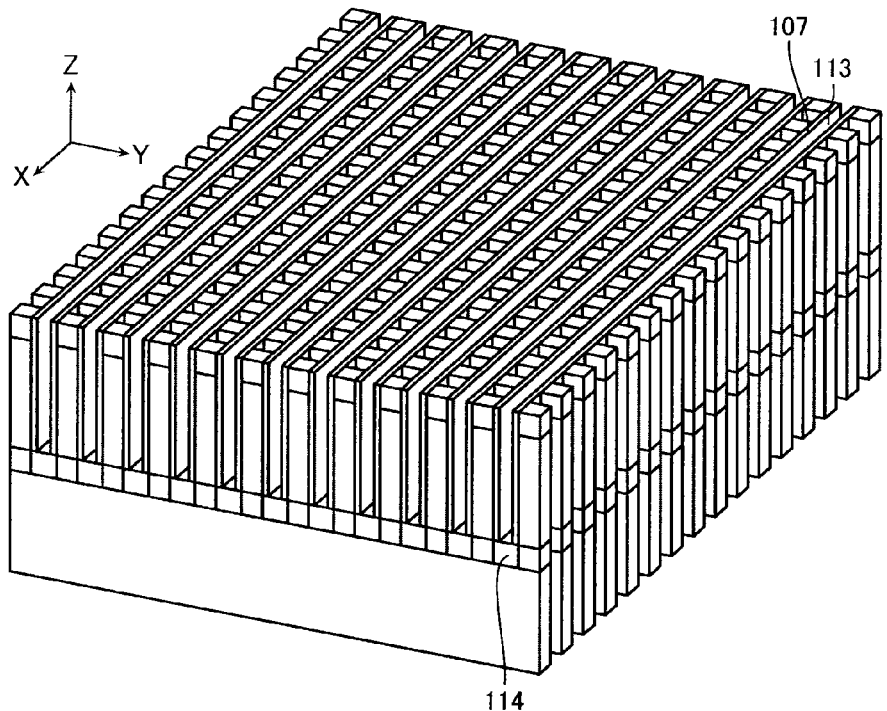
FIG. 42 is an example of a view showing the process sequence of the forming process of the memory cell array of the memory device according to same embodiment.

Following this, as shown in FIG. 42, the gate insulating film 107 of the selection element is formed on a side surface of the plurality of trenches 113. The gate insulating film 107 is formed with a thickness in the Y direction of 5 nm.

Figure 43:
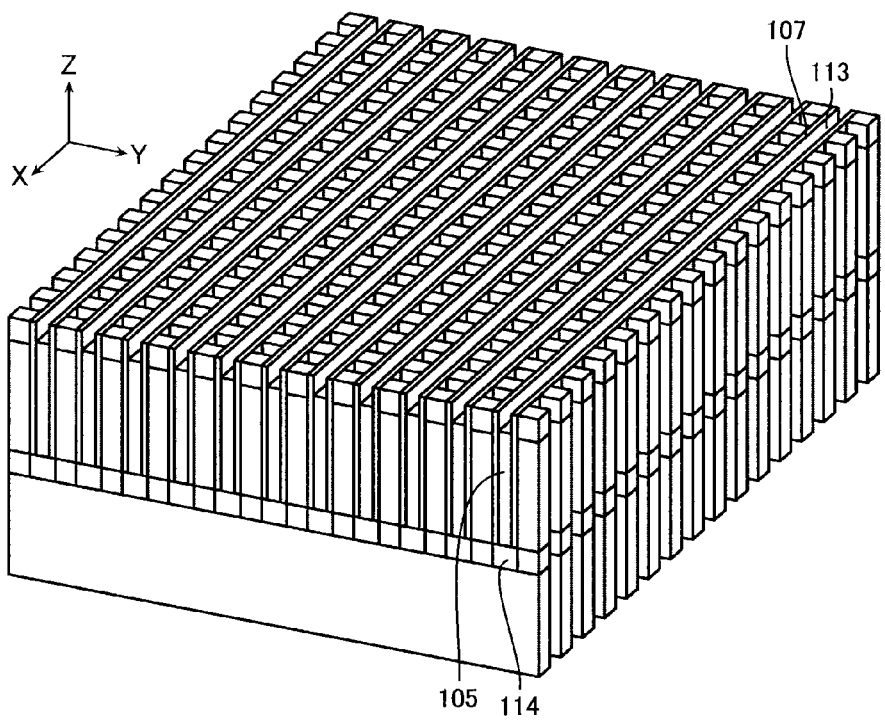
FIG. 43 is an example of a view showing the process sequence of the forming process of the memory cell array of the memory device according to same embodiment.

Following this, as shown in FIG. 43, the plurality of trenches 113 having their bottom surface filled by the interlayer insulating film 114 and having the gate insulating film 107 formed on their side surface are filled with a layer which is to become the gate line 105. Then, the layer which is to become the gate line 105 is etched back until its thickness in the Z direction becomes 140 nm. This process results in the gate line 105 being formed. The gate line 105 is formed having N+ polysilicon as its material.

Figure 44:
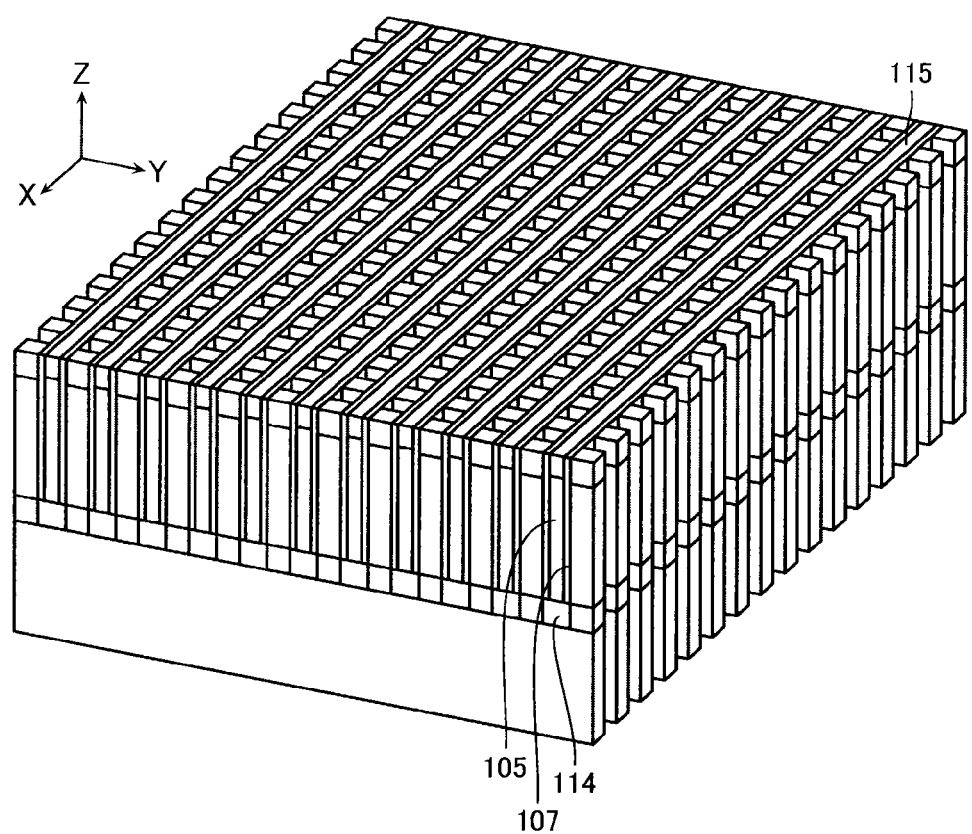
FIG. 44 is an example of a view showing the process sequence of the forming process of the memory cell array of the memory device according to same embodiment.

Following this, as shown in FIG. 44, the plurality of trenches 113 having their bottom surface filled by the interlayer insulating film 114, having the gate insulating film 107 formed on their side surface, and having the gate line 105 formed between the gate insulating films 107 on the interlayer insulating film 114 are filled with an interlayer insulating film 115. Then, planarization by CMP is performed, whereby the interlayer insulating film 115 attains a thickness in the Z direction in the trench 113 of approximately 30 nm.

Figure 45:
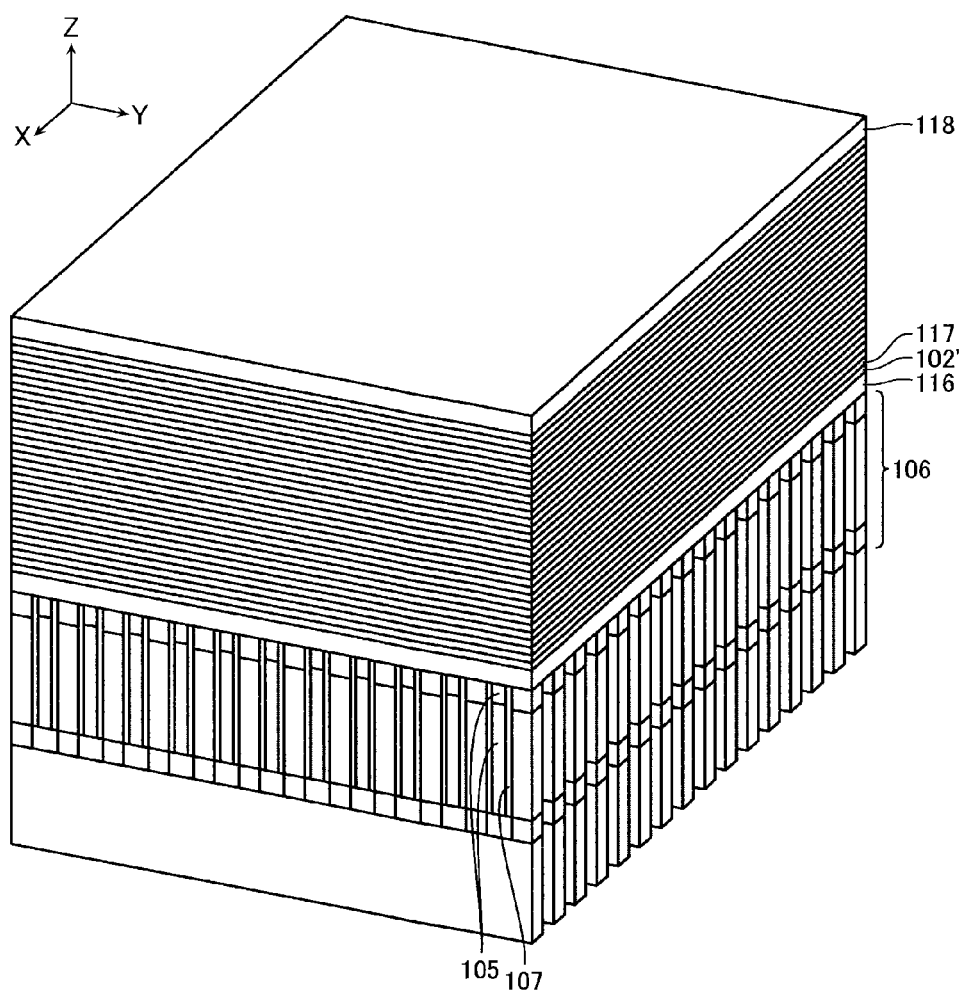
FIG. 45 is an example of a view showing the process sequence of the forming process of the memory cell array of the memory device according to same embodiment.

Following this, as shown in FIG. 45, an interlayer insulating film 116 is stacked on the silicon portion 106 of the selection element, the gate insulating film 107, and the interlayer insulating films 112 and 115. The interlayer insulating film 116 is formed with a thickness in the Z direction of 20 nm, and having SiO$_2$ as its material. Then, layers 102' which are to become the word lines are stacked repeatedly on the interlayer insulating film 116, via interlayer insulating films 117. At this time, 16 layers of the layers 102' which are to become the word lines are stacked. Each of the layers 102' which are to become the word lines is formed with a thickness in the Z direction of 10 nm, and having TiN as its material. Moreover, each of the interlayer insulating films 117 is formed with a thickness in the Z direction of 7 nm, and having SiO$_2$ as its material. Then, an interlayer insulating film 118 is stacked on the layers 102' which are to become the word lines. The interlayer insulating film 118 is formed with a thickness in the Z direction of 13 nm, and having SiO$_2$ as its material.

Figure 46:
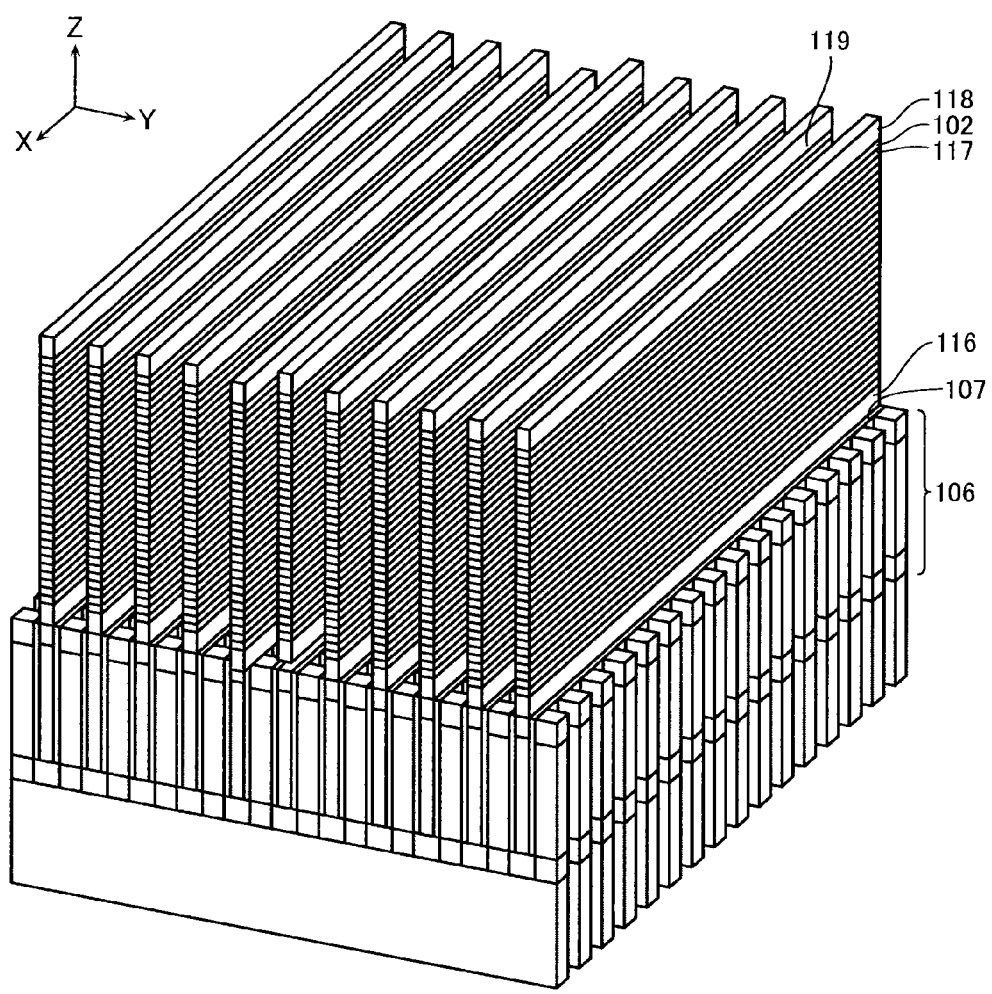
FIG. 46 is an example of a view showing the process sequence of the forming process of the memory cell array of the memory device according to same embodiment.

Following this, as shown in FIG. 46, RIE or the like is employed to form a plurality of trenches 119 in the interlayer insulating film 118, the plurality of layers 102' which are to become the word lines and interlayer insulating films 117, and the interlayer insulating film 116, the plurality of trenches 119 being formed at a position of the silicon portion 106 of the selection element, the gate insulating film 107, and the interlayer insulating film 112 as viewed from the Z direction, and the plurality of trenches 119 extending in the X direction and having the Z direction as a depth direction. This process results in the layer 102' which is to become the word line becoming the word line 102. The word lines 102 are formed in a line-and-space pattern of line width 18 nm, line spacing 22 nm, and half pitch 20 nm.

Figure 47:
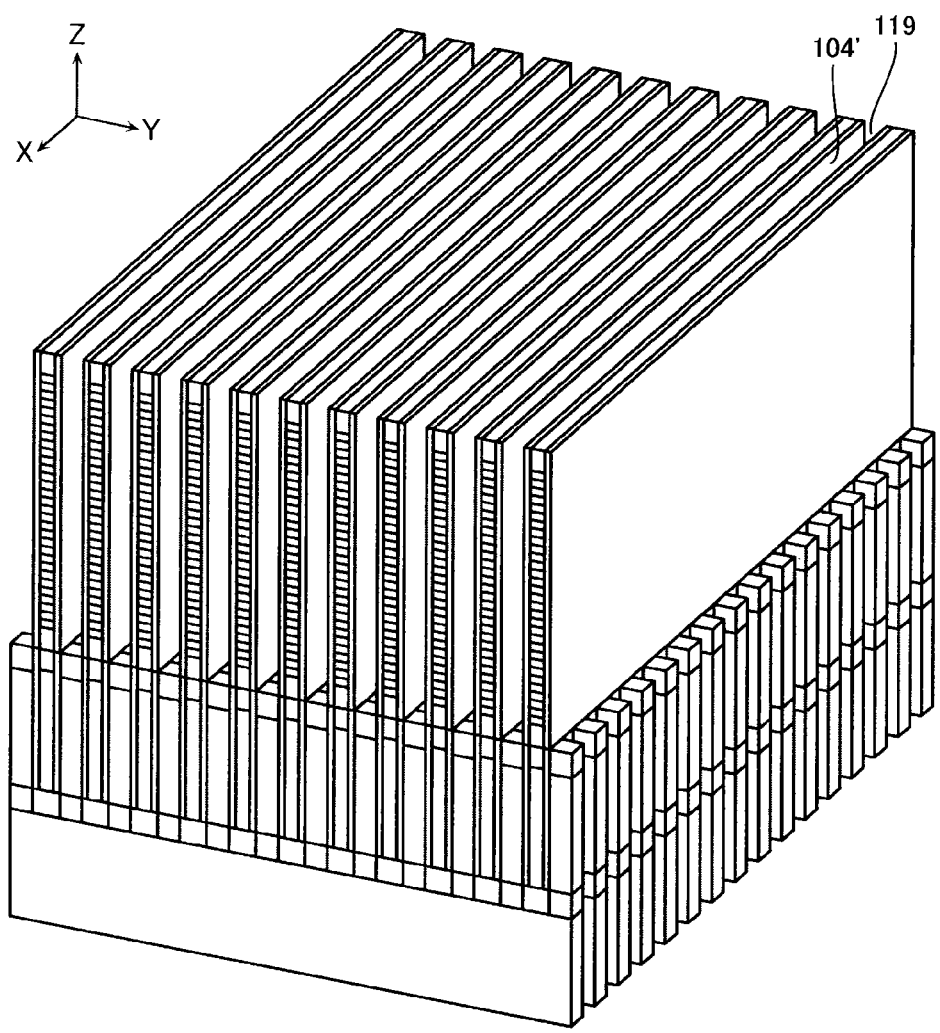
FIG. 47 is an example of a view showing the process sequence of the forming process of the memory cell array of the memory device according to same embodiment.

Following this, as shown in FIG. 47, a layer 104' which is to become the resistance varying material is formed on a side surface of the plurality of trenches 119. The layer 104' which is to become the resistance varying material, after being formed uniformly as a film, has portions on the interlayer insulating film 118, the silicon portion 106 of the selection element, and the interlayer insulating film 112 removed by an etching-back process to be formed with a thickness in the Y direction of the side surface of the trench 119 of 4 nm.

Figure 48:
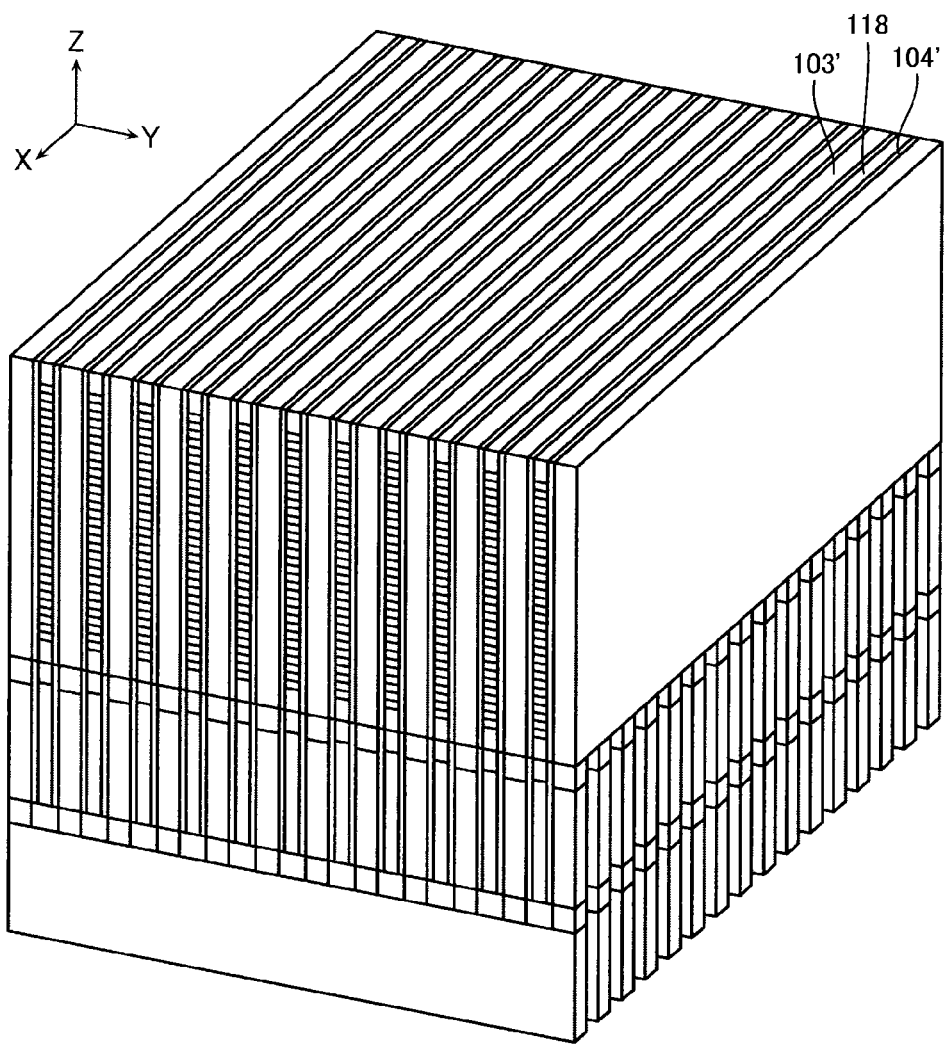
FIG. 48 is an example of a view showing the process sequence of the forming process of the memory cell array of the memory device according to same embodiment.

Following this, as shown in FIG. 48, the plurality of trenches 119 having the layer 104' which is to become the resistance varying material formed on their side surface are filled with a layer 103' which is to become the bit line. The layer 103' which is to become the bit line is formed having N+ polysilicon as its material. Then, CMP or the like is employed to smooth an upper surface of the layer 103' which is to become the bit line, the layer 104' which is to become the resistance varying material, and the interlayer insulating film 118.

Figure 49:
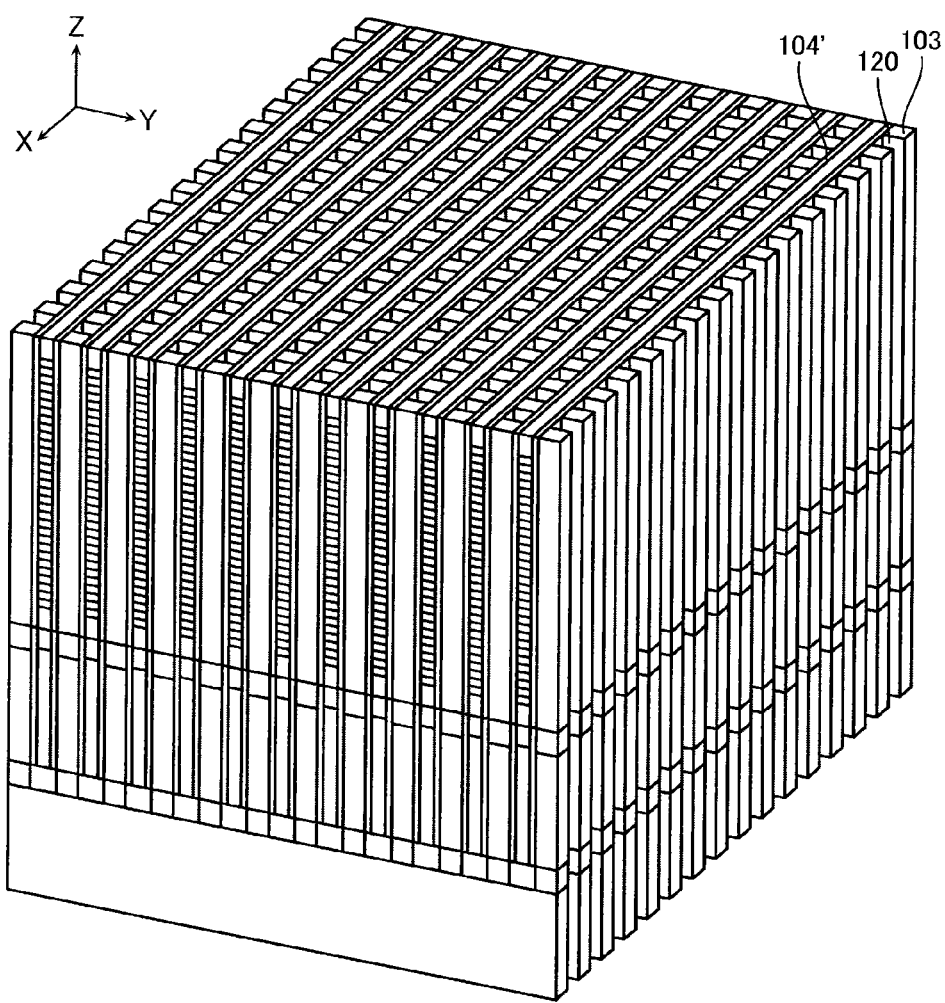
FIG. 49 is an example of a view showing the process sequence of the forming process of the memory cell array of the memory device according to same embodiment.

Following this, as shown in FIG. 49, RIE or the like is employed to form a plurality of trenches 120 in the layer 103' which is to become the bit line, the plurality of trenches 120 being formed at a position of the interlayer insulating film 112 as viewed from the Z direction, and having the Z direction as a depth direction. This process results in the layer 103' which is to become the bit line becoming the bit line 103. The bit lines 103 are formed in a line-and-space pattern of line width 20 nm and line spacing 20 nm. Note that in this process, the plurality of trenches 120 may be formed also in the layer 104' which is to become the resistance varying material. In this case, the resistance varying material 104 divided in the X direction as in the memory cell array 100 shown in FIG. 1, can be formed.

Finally, the plurality of trenches 120 are filled with an interlayer insulating film 121 not illustrated. Then, CMP or the like is employed to smooth an upper surface of the bit line 103, the layer 104' which is to become the resistance varying material, and the interlayer insulating films 118 and 121.

The above forming process shown in FIGS. 38 to 49 allows the memory cell array 100 of the memory device to be formed.

In the present embodiment, the cell can be formed in a self-aligning manner by formation of the bit lines and the word lines, hence it is difficult for a misalignment of the bit lines and the word lines, and so on, to occur. As a result, the present embodiment makes it possible to provide a memory device comprising a memory cell array having a high dimensional accuracy and positional accuracy.

Other

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A memory device, comprising:
    a memory cell array including: electrodes that are aligned in a first direction and extend in a second direction intersecting the first direction; a column line that extends in the first direction; a selection element that is provided at an end of the column line, and is configured to select the column line; and a memory cell that is provided at intersections of the electrodes and the column line;
    a selection circuit including: an electrode selection circuit being configured to select one selected electrode from the electrodes; and a selection element control circuit being configured to select the column line by the selection element; and
    a data processing circuit including:
        a data write pre-processing circuit being configured to process input data to generate first intermediate data;
        a data write processing circuit being configured to sequentially set a voltage difference between the selected electrode and the selected column line based on the first intermediate data;
        a data read processing circuit being configured to detect a current flowing in the selected column line or a voltage of the selected column line and sequentially generate second intermediate data from a result of that detection; and
        a data read post-processing circuit being configured to process the second intermediate data to generate output data,
    the data write pre-processing circuit and the data read post-processing circuit being configured to correct a difference that may occur between the input data and the output data.

2. The memory device according to claim 1, wherein the correcting function of the data write pre-processing circuit and the data read post-processing circuit being configured to correct a difference between the first intermediate data and the second intermediate data.

3. The memory device according to claim 1, wherein the data write processing circuit is configured to sequentially set a voltage of the selected electrode in a state where a voltage of the selected column line is set constant.

4. The memory device according to claim 1, further comprising
    a global column line connected to the end of the column line, wherein
    the data write processing circuit is configured to sequentially set a voltage difference between the selected electrode and the global column line connected to the selected column line based on the first intermediate data, and
    the data read processing circuit is configured to detect a current flowing in the global column line connected to the selected column line or a voltage of the global column line connected to the selected column line and sequentially generate second intermediate data from a result of that detection.

5. The memory device according to claim 1, wherein the memory cell includes a memory film having a resistance varying material.

6. The memory device according to claim 1, wherein the data write pre-processing circuit includes a precoder being configured to correct a difference occurring between data stored by the memory cell and the second intermediate data.

7. The memory device according to claim 1, wherein the data write pre-processing circuit includes a waveform equalizer being configured to correct a difference occurring between the first intermediate data and data stored by the memory cell.

8. The memory device according to claim 1, wherein the data read post-processing circuit includes a whitening matched filter being configured to reduce a noise correlation of the second intermediate data.

9. The memory device according to claim 1, wherein the data read post-processing circuit includes a maximum likelihood decoder being configured to estimate the output data of maximum likelihood from the second intermediate data.

10. A method of controlling a memory device, the memory device comprising:
    a memory cell array including: electrodes that are aligned in a first direction and extend in a second direction intersecting the first direction; a column line that extends in the first direction; a selection element that is provided at an end of the column line; and a memory cell that is provided at intersections of the electrodes and the column line;
    a selection circuit including: an electrode selection circuit being configured to select one selected electrode from the electrodes; and a selection element control circuit being configured to select the column line by the selection element; and
    a data processing circuit configured to write and read data to/from the memory cell,
    the method comprising the following steps executed by the data processing circuit, namely the steps of:
    during write and read of data to/from the memory cell,
    processing input data to generate first intermediate data;
    sequentially setting a voltage difference between the selected electrode and the selected column line based on the first intermediate data;
    detecting a current flowing in the selected global bit line and sequentially generating second intermediate data from a result of that detection;
    processing the second intermediate data to generate output data; and
    when processing the input data to generate the first intermediate data and when processing the second intermediate data to generate the output data, correcting a difference that may occur between the input data and the output data.

11. The method of controlling a memory device according to claim 10, further comprising
    the following step executed by the data processing circuit, namely the step of:
    when correcting the difference that may occur between the input data and the output data, correcting a difference between the first intermediate data and the second intermediate data.

12. The method of controlling a memory device according to claim 10, further comprising
    the following step executed by the data processing circuit, namely the step of:

when sequentially setting the voltage difference between the selected electrode and the selected column line, sequentially setting a voltage of the selected electrode in a state where a voltage of the selected column line is set constant.

13. The method of controlling a memory device according to claim 10, the memory device further comprising a global column line connected to an end of the column line, the method further comprising the following step executed by the data processing circuit, namely the step of:

sequentially setting a voltage difference between the selected electrode and the global column line connected to the selected column line based on the first intermediate data; and detecting a current flowing in the global column line connected to the selected column line or a voltage of the global column line connected to the selected column line and sequentially generating second intermediate data from a result of that detection.

14. The method of controlling a memory device according to claim 10, wherein the memory cell includes a memory film having a resistance varying material.

15. The method of controlling a memory device according to claim 10, further comprising the following step executed by the data processing circuit, namely the step of:

when correcting the difference that may occur between the input data and the output data, correcting a difference occurring between data stored by the memory cell and the second intermediate data.

16. The method of controlling a memory device according to claim 10, further comprising the following step executed by the data processing circuit, namely the step of:

when correcting the difference that may occur between the input data and the output data, correcting a difference occurring between the first intermediate data and data stored by the memory cell.

17. The method of controlling a memory device according to claim 10, further comprising the following step executed by the data processing circuit, namely the step of:

when correcting the difference that may occur between the input data and the output data, reducing a noise correlation of the second intermediate data.

18. The method of controlling a memory device according to claim 10, further comprising the following step executed by the data processing circuit, namely the step of:

when correcting the difference that may occur between the input data and the output data, estimating the output data of maximum likelihood from the second intermediate data.

19. A memory system, comprising:
a memory main body chip that includes:
a memory cell array including: electrodes that are aligned in a first direction and extend in a second direction intersecting the first direction; a column line that extends in the first direction; a selection element that is provided at an end of the column line, and is configured to select the column line; and a memory cell that is provided at intersections of the electrodes and the column line, a selection circuit including: an electrode selection circuit that selects one selected electrode from the electrodes; and a selection element control circuit being configured to select the column line by the selection element, and a second data processing circuit that performs write and read of data to/from the memory cell; and a controller chip including a first data processing circuit that performs write and read of data to/from the memory cell, the first data processing circuit of the controller chip including a first data write pre-processing circuit that processes input data to generate third intermediate data, the second data processing circuit of the memory main body chip including:

a second data write pre-processing circuit that processes the third intermediate data to generate first intermediate data;

a data write processing circuit that sequentially sets a voltage difference between the selected electrode and the selected column line based on the first intermediate data;

a data read processing circuit that detects a current flowing in the selected column line and sequentially generates second intermediate data from a result of that detection; and a second data read post-processing circuit that processes the second intermediate data to generate fourth intermediate data, the first data processing circuit of the controller chip further including a first data read post-processing circuit that processes the fourth intermediate data to generate output data, and the first and second data write pre-processing circuits and the first and second data read post-processing circuits having a correcting function that corrects a difference that may occur between the input data and the output data.

20. The memory system according to claim 19, comprising a plurality of the memory main body chips.

* * * * *